(12) United States Patent
Solomon

(10) Patent No.: US 10,593,092 B2
(45) Date of Patent: Mar. 17, 2020

(54) INTEGRATED 3D-D2 VISUAL EFFECTS DISPLAY

(71) Applicant: Dennis J Solomon, Yarmouth Port, MA (US)

(72) Inventor: Dennis J Solomon, Yarmouth Port, MA (US)

(*) Notice: Subject to any disclaimer, the term of this patent is extended or adjusted under 35 U.S.C. 154(b) by 0 days.

(21) Appl. No.: 14/189,232

(22) Filed: Feb. 25, 2014

(65) Prior Publication Data
US 2015/0243068 A1 Aug. 27, 2015
US 2019/0139290 A9 May 9, 2019

Related U.S. Application Data

(63) Continuation-in-part of application No. 12/456,401, filed on Jun. 15, 2009, now Pat. No. 8,730,129, and a continuation-in-part of application No. 13/294,011, filed on Nov. 10, 2011.

(60) Provisional application No. 61/962,877, filed on Nov. 18, 2013, provisional application No. 61/850,920, filed on Feb. 25, 2013.

(51) Int. Cl.
| G06F 3/01 | (2006.01) |
| G02B 27/01 | (2006.01) |
| G06T 15/00 | (2011.01) |
| H01L 27/15 | (2006.01) |
| G02C 5/20 | (2006.01) |
| G02C 5/08 | (2006.01) |
| G02B 26/10 | (2006.01) |
| G02C 5/00 | (2006.01) |

(52) U.S. Cl.
CPC ............ *G06T 15/00* (2013.01); *G02B 27/017* (2013.01); *G02B 27/0172* (2013.01); *G02B 27/0176* (2013.01); *G06F 3/013* (2013.01); *H01L 27/156* (2013.01); *G02B 26/101* (2013.01); *G02B 2027/013* (2013.01); *G02B 2027/014* (2013.01); *G02B 2027/0134* (2013.01); *G02B 2027/0178* (2013.01); *G02B 2027/0194* (2013.01); *G02C 5/006* (2013.01); *G02C 5/08* (2013.01); *G02C 5/20* (2013.01)

(58) Field of Classification Search
None
See application file for complete search history.

(56) References Cited

U.S. PATENT DOCUMENTS

| 2004/0108046 | A1* | 6/2004 | Kerr | G02B 6/04 156/204 |
| 2004/0196435 | A1* | 10/2004 | Dick | A61B 3/14 351/222 |
| 2006/0132382 | A1* | 6/2006 | Jannard | G02C 11/06 345/8 |
| 2007/0120974 | A1* | 5/2007 | Chen | G06F 3/011 348/61 |
| 2007/0279852 | A1* | 12/2007 | Daniel | A44C 5/0007 361/679.03 |

(Continued)

*Primary Examiner* — James A Thompson

(57) ABSTRACT

The present invention discloses an improved method and device for the immersive display of three-dimensional images with convertible eyeglasses and wristwatch structures. An improved method for manufacturing a visual display incorporating a scanned light source and an improved method of presenting visual information are disclosed. A complete, immersive display environment is also presented.

20 Claims, 44 Drawing Sheets

(56) References Cited

U.S. PATENT DOCUMENTS

| | | | | |
|---|---|---|---|---|
| 2008/0143895 | A1* | 6/2008 | Peterka | G02B 27/0093 349/15 |
| 2009/0109292 | A1* | 4/2009 | Ennis | A42B 3/042 348/158 |
| 2010/0253700 | A1* | 10/2010 | Bergeron | G03B 35/00 345/633 |
| 2011/0007277 | A1* | 1/2011 | Solomon | G02B 26/105 353/7 |
| 2011/0169730 | A1* | 7/2011 | Sugihara | G06F 3/013 345/156 |
| 2012/0056799 | A1* | 3/2012 | Solomon | G02B 27/017 345/55 |
| 2013/0278631 | A1* | 10/2013 | Border | G02B 27/017 345/633 |
| 2014/0073481 | A1* | 3/2014 | Aibara | A63B 24/0084 482/1 |
| 2015/0084949 | A1* | 3/2015 | Venkatesh | H04N 13/0275 345/419 |
| 2015/0097756 | A1* | 4/2015 | Ziarati | G02B 27/0172 345/1.3 |
| 2015/0103404 | A1* | 4/2015 | Rudy | G02B 6/00 359/567 |

* cited by examiner

X-Y SPACING

X, X-Y SCAN

3000

3000

INTEGRATED 3D-D2 VISUAL EFFECTS DISPLAY

This continuation-in-part and divisional application incorporates by reference my related and earlier-filed applications and disclosures including Ser. Nos. 12/456,401 and 13/294,011 and provisional applications 61/962,877; 61/850,920; 61/850,082.

Allowed patent application Ser. No. 12/456,401 is incorporated herein by reference.

Further including continuation-in-part priority benefit of Ser. No. 11/149,638 incorporated herein by reference.

TECHNICAL FIELD

This invention relates generally to audiovisual effects displays and environments; and more particularly to novel integration of personal head-mounted glasses, 3D imaging displays environments and other audio-visual effects.

BACKGROUND ART

Miniature displays are also well known and may involve a miniaturized version of planar or stereoscopic 3D technologies which display a distinct image to each eye. With increase miniaturization and incorporation into eyeglasses design, head-mounted displays (HMDs) have enjoyed an increasing popularity for applications ranging from fighter pilot helmet displays and endoscopic surgery to virtual reality games and augmented reality glasses. The 3D HMD display technology has numerous extensions including Near-to-Eye (NTD)—periscopes and tank sights; Heads-Up (HUD)—windshield and augmented reality—and immersive displays (IMD)—including CAVE, dome and theater size environments. The principal employed varies little from that of the 1930 Polaroid™ glasses, or the barrier stereoscopic displays of the 1890s, despite extensive invention related to the active technology to produce each display has occurred over the past twenty years. As applied to small displays, these techniques evolved to include miniature liquid crystal, field emission, OLED, quantum dot and other two-dimensional matrix displays; variations of virtual screen and retinal scanning methodologies. Other approaches include scanning fiber optic point sources such as disclosed by Palmer, U.S. Pat. No. 4,234,788, compact folded, total internal reflection optical displays disclosed by Johnson in U.S. Pat. No. 4,109,263. These inventions have provided practical solutions to the problem of providing lightweight, high resolution displays but are limited to providing a stereoscopic view by means of image disparity.

But, object visual accommodation is not incorporated in the previous inventions. A solution to the problem of accommodation for all displays was disclosed by A. C. Traub in U.S. Pat. No. 3,493,390, Sher in U.S. Pat. No. 4,130,832, and others. These inventors proposed a modulated scanning signal beam coordinated with a resonantly varying focal length element disposed in the optical path between the image display and the observer. These solutions are bulky, and do not scale for practical usage.

It is also well known in the field that wavefront-based technologies, such as digital phase and diffractive holography, may at high-resolutions, convey a limited amount of accommodation data. However, their limitations including coherent effects, impart significant specular and other aberrations degrading performance and inducing observer fatigue.

Alternative approaches where a data-controlled, variable focal length optical element was associated with each pixel of the display were such of experimentation by this inventor and others, including Sony Corporation researchers, in Cambridge, Mass. during the late 1980s. In 1990, Ashizaki, U.S. Pat. No. 5,355,181, of the Sony Corporation, disclosed an HMD with a variable focus optical system.

Augmented reality had in origins at MIT Lincoln Laboratory in the 1960s and involved in a translucent HMD with head-orientation tracking in a wall projection immersive environment. The 'virtual image' in the HMD did not have accommodation, and the immersive environment did not include spatially-tracked, portable audience elements with multiplicative effects.

Virtual and Augmented Reality systems for enabling one or more users to interact with a virtual world comprised of virtual world data have been the subject of extensive experimentation and development from the earliest "heads up" fighter pilot displays to the intricate, 'serious game' world of defense simulations. These systems historically have a multiplicity of data sources including maps, GPS and orientation-enabled cameras, a computer network, and computational devices which enable the display to the user of real and virtual scenes and objects, often not only updated in real-time, but also predictively plotted in future time. Increasingly these systems have object or face recognition, enabling responsive and predictive displays.

Despite the improvements during the past decades, the significant problem of providing a low cost, highly accurate visual display with full accommodation remains. One of the principal limitations has been the inability of sequentially resonant or programmed variable focal length optics combined with scanning configurations to properly display solid three dimensional pixels, orthogonal to the scanning plane. Another limitation is the inability of the observer's eye to properly and comfortably focus on rapidly flashing elements. Numerous inventions have been proposed which have generally been too complicated to be reliable, too expensive to manufacture, without sufficient resolution, accuracy, stability to gain wide acceptance.

A further problem solved by the innovation of present invention is the method and apparatus to comfortably and useful carry and use an audio-visual display on one's person.

The present invention solves these problems, particularly related to the portable multiphasic design, augmented reality, environmental dynamics and the accurate display of 3D pixels.

BRIEF SUMMARY OF THE INVENTION

The present invention discloses an improved method and device for the display of a visual image in two or three dimensions including stereoscopic and/or visual accommodation.

Another object of the present invention is an improved method and device for an immersive, augmented reality environment.

Another object of the present invention is an improved method and device for monitoring the physiological, psychological, fixation, processing, awareness and response of an individual.

Another object of the present invention is an improved method and device for constructing an accurate, augmented reality, visual display with automatic biocular alignment, Another object of the present invention is an improved method and device for constructing an accurate, augmented reality, visual display without an intermediate image plane, Another object of the present invention is an improved method and device for manufacturing a visual display independent of coherence and wavefront curvature constraints, Another object of the present invention is an improved method and device for thin, wave-guided display.

Another object of the present invention is an improved method of presenting visual information, Another object of the present invention is an improved method and device for an immersive, augmented reality, audience performance environment.

Another object of the present invention is an improved method and device to present visual information in compact form unaffected by an external environment.

BRIEF DESCRIPTION OF THE DRAWINGS

The above and still further objects, features and advantages of the present invention will become apparent upon consideration of the following detailed disclosure of specific embodiments of the invention, especially when taken in conjunction with the accompanying drawings, wherein.

DETAILED DESCRIPTION OF THE INVENTION

The present invention relates to improved methods and constructions to achieve a complex visual display environment which may include dynamic and precise focal length for each pixel of each frame of a visual display and the ability to present a comfortable image, two or three-dimensional, virtual or augmented, to a single or multiple observers which may be participating in an audience performance.

It discloses the general elements of the present invention which may include but is not limited to:

1. A personal audio-visual device which may be wearable such as a handheld wand or communications device; body or clothing-affixed device such as a watch, wrist or armband, earring, necklace, medallion or other jewelry; a head-mounted device such as a helmet or glasses; or a dispersible device such as a ball, balloon, Frisbee, etc., all of which may be responsive to or interactive to user state and input, or optionally external control, 2. A communications control device which may control one or more personal audio-visual devices, and 3. An augmented-environment device which may include a real-time display or projection.

Figure 1:
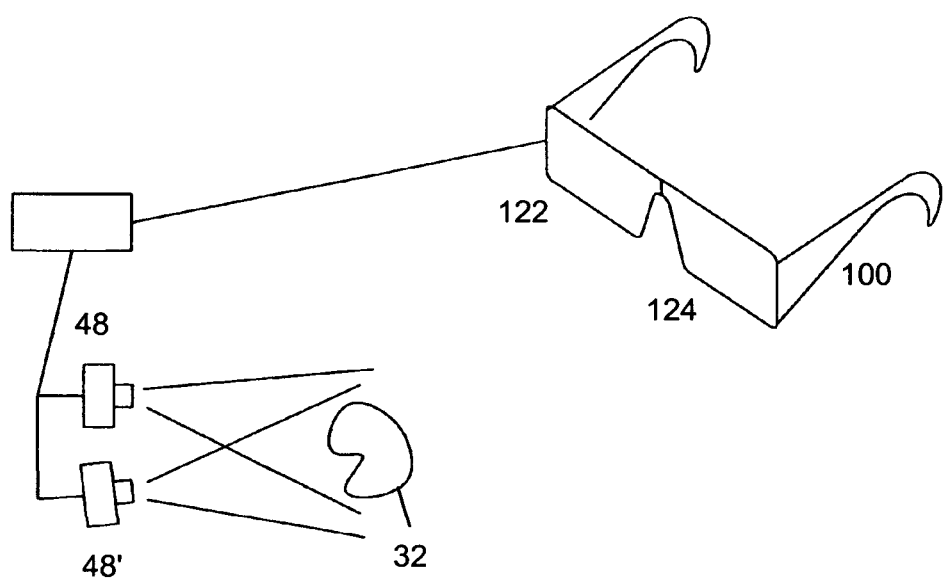
FIG. 1 presents a general view of binocular stereoscopic viewers.

One preferred embodiment of the personal device enables a full accommodative, stereoscopic, augmented reality, audio-visual experience with a convenient portability and use. This preferred embodiment provides a complete personal audio-visual experience in the form of wearable eyeglasses or head-mounted environment (HME) which may be removably-affixed as a wristband or watch. The present invention allows but does not require that the pixels or light sources be transparent, or that any light is actually transmitted through them. This approach has many technological, performance and manufacturing advantages including the ability to present discrete, collinear pixels of different focal distances with improved acuity within the period of visual integration. FIG. 1 presents prior art with elements locally renumbered from allowed, parent U.S. patent application Ser. No. 12/456,401 FIG. 1, disclosing a generalized stereo viewing system which "presents the image of an object 32 taken by two cameras 48 and 48', displaced by a small distance equivalent of the separation of a viewers's eyes, to tv-type viewer panels 122 and 124, which corresponds to the view that would be seen by each eye. Commonly, the viewer panels 122 and 124 are mounted on an eyeglass or goggle-type frame 100."

Figure 2A:
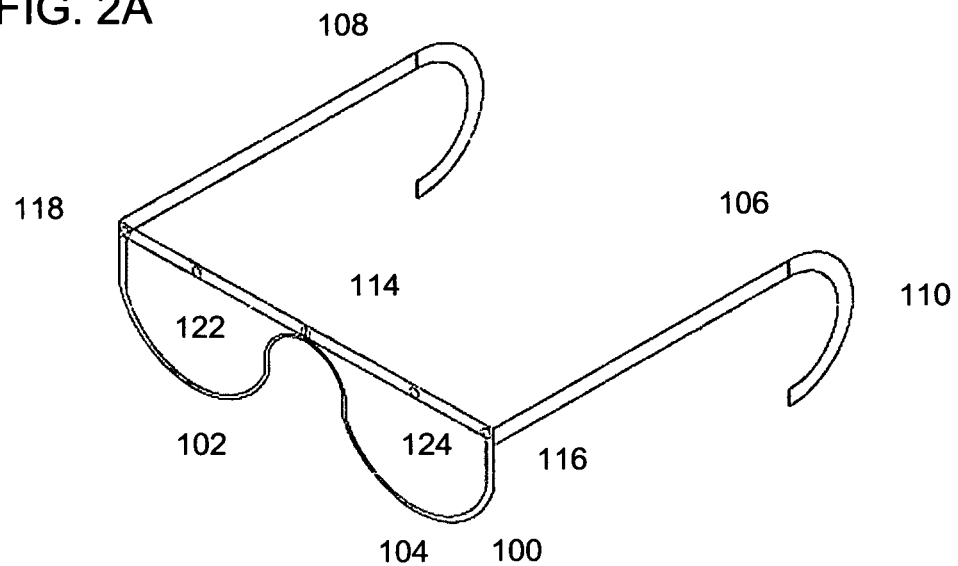
FIGS. 2A, 2B & 2C presents a general view of the wrist-wearable, stereoviewer embodiment of the present invention

FIG. 2A presents a preferred convertible embodiment of the present invention having a convertible frame 100 in the form of eyeglasses or goggles, a first display region 102, a second display region 104, a first arm 106, a second arm 108, a first ear assemblage 110, a second ear assemblage 112, a first camera 116, a second camera 118, a first display 122, a second display 124.

In a first configuration, the present invention functions as a head-mounted, augmented reality display having some or all of the features common to the field or disclosed in my previous or pending patent applications included by reference.

The displays 122, 124 may be any type including but not limited to those disclosed herein or in my previously-filed applications, miniature LCD, LED, OLED, QD, fluorescent, electroluminescent, transformed, array, scanned, static or dynamic focus, one or two-sided, of occlusive, transparent, or variable optics, engaging a limited or comprehensive field of view.

These may include the display of images to the user's eyes at a static or dynamic focal distance, accompanying audio, one or more affixed or mobile cameras capturing the user's environment, one or more cameras capturing the user's eye position, motion and state which may be incorporated into the display, sensors monitoring geophysical position (GPS), motion (acceleration, gyro), physiological state (temp, heart beat, brain waves, etc.), environmental state (temperature, humidity, pressure, audio, air quality, insolation, ambient illumination, scents, etc.).

The convertible frame 100 may have flexible, elastic, hinged regions 114 on the bridge, and on the arms 106, 108 which allow the frame 100 to be draped or wrapped about a curved object, including an arm, and fastened. Alternatively, the frame 100 material may be flexible. Examples include but are not limited to: elastomers, woven fabrics, linked chains, pinned segments, or other configurations.

Figure 2B:
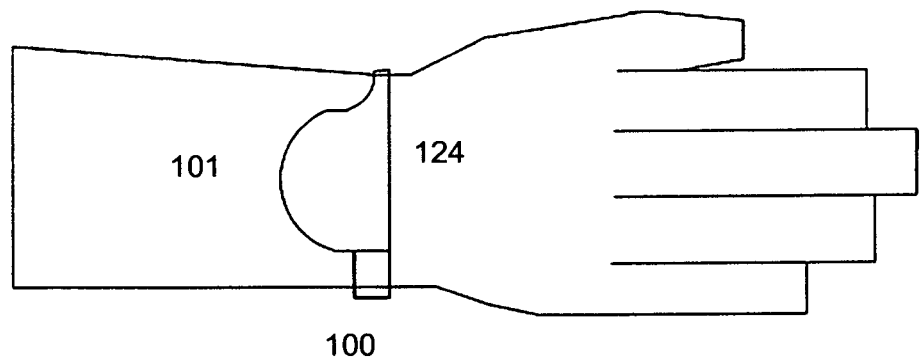

FIG. 2B presents a posterior view of the second configuration of the present invention where the convertible frame 100 is folded about the wrist 101 of the user having the second display 124 presenting on the posterior wrist and the first display 122 (not shown) presenting on the anterior wrist.

Figure 2C:
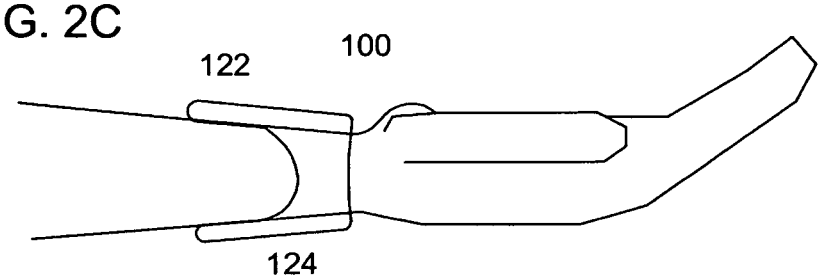

FIG. 2C presents a top view of the second configuration of the present invention where the convertible frame 100 is folded about the wrist 101 of the user having the second outer display 124 presenting on the posterior wrist and the first out display 122 presenting on the anterior wrist.

Figure 3A:
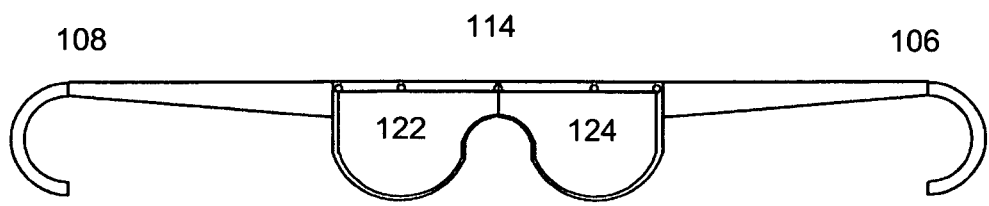
FIGS. 3A-D presents a preferred embodiment having an articulated bridge.

FIG. 3A presents a front view of the of the convertible frame 100 may have flexible, elastic, hinged regions 114 on the bridge, and on the arms 106, 108 which allow the frame 100 to be draped or wrapped about a curved object, including an arm, and fastened.

Figure 3B:
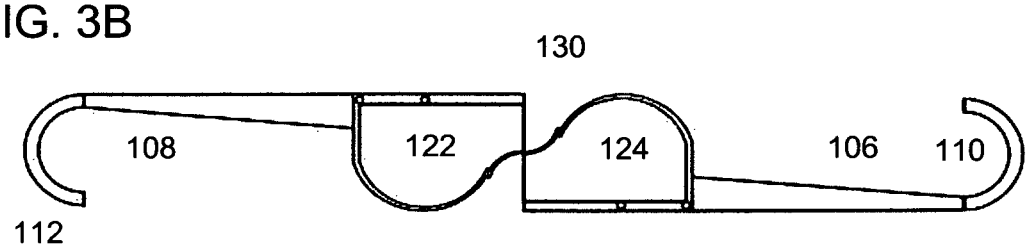

FIG. 3B presents a front view of the of the convertible frame 100 having a flexible, elastic, hinged pivot region 130 on the bridge, and on the arms 106, 108 which allow the frame 100 to be folded upon itself, the arms 106,108 forming a strap-like fastener to secure the frame 100 to the wrist.

Figure 3C:
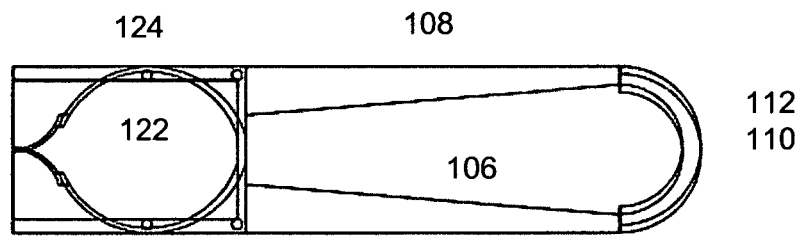

FIG. 3C presents a front view of the of the folded convertible frame 100 of FIG. 5, having a flexible, elastic, hinged pivot region 130 on the bridge, and on the arms 106, 108 which allow the frame 100 to be folded upon itself, the arms 106,108 forming a strap-like fastener to secure the frame 100 to the wrist.

Figure 3D:
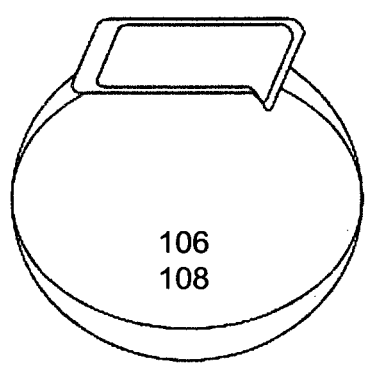

FIG. 3D presents a end view of the of the folded convertible frame 100 of FIG. 5, having a flexible, elastic, hinged pivot region 130 on the bridge, and on the arms 106, 108 which allow the frame 100 to be folded upon itself, the arms 106, 108 forming a strap-like fastener to secure the frame 100 to the wrist, and showing the first outer display 122 presenting upward.

Figure 4A:
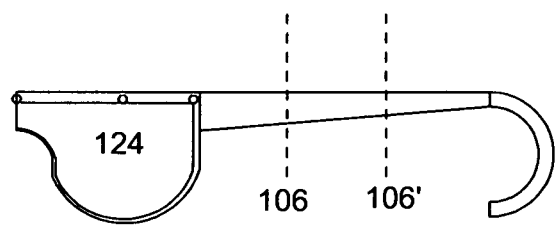
FIGS. 4A-B presents a preferred embodiment having a foldable temple.

FIG. 4A presents a front unfolded view of the of the folded convertible frame 100 and arm having a first fold region 106 and a second fold region 106' enabling the arm to be folded upon itself.

Figure 4B:
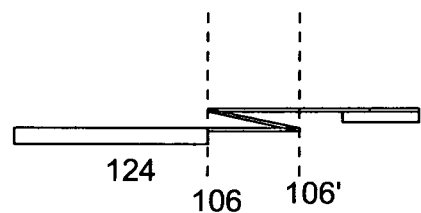

FIG. 4B presents a front folded view of the of the folded convertible frame 100 and arm having a first fold region 106 and a second fold region 106' enabling the arm to be folded upon itself.

Figure 5A:
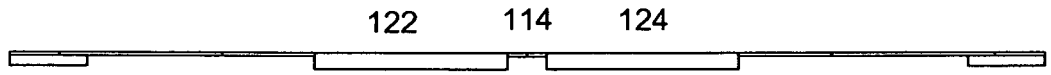
FIGS. 5A-B presents a preferred embodiment having repositionable elements. SB4 and V1 presents an HMD embodiment

FIG. 5A presents an expanded top view of the present invention where the display 122, 124 may be separated or overlapped to convert to a wrist configuration.

Figure 5B:
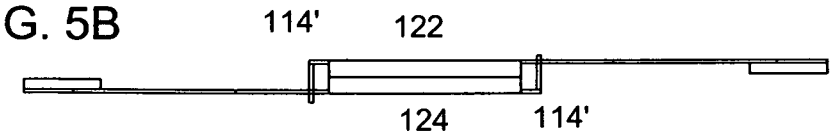

FIG. 5B presents wrist-converted top view of the present invention where the display 122, 124 are overlapped to convert to a wrist configuration. The 'hinge' region 114 may have connected/loop structure 114' to which the opposing arm/strap 106, 108 is removably affixed in the wrist configuration.

Figure 6A:
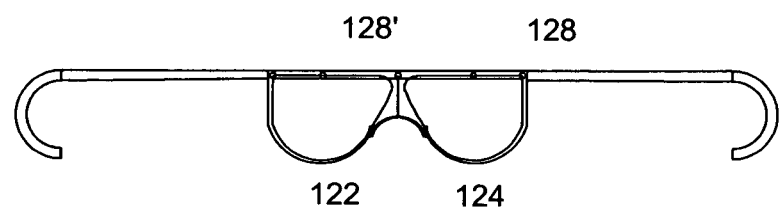
FIGS. 6A-B presents a preferred embodiment having wrappable temples.
Figure 6B:
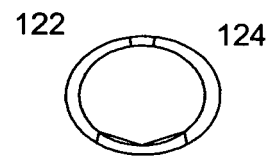

FIG. 6A presents an expanded front view of the present invention where the ear arms 128 are in the form of wire and may be loop around and over the alternate display 122, 124 to convert to a wrist configuration FIG. 6B presents an front wrist view of the present invention where the ear arms 128 are in the form of wire and may be loop around and over the alternate display 122, 124 to convert to a wrist configuration Other constructions may include but are not limited to the following features:
Construction
1. folding
   flat
   fixed curvature
   flexible
2. sliding
   two pieces
   internal
   slide and twist
3. layers
   outer protective
   outer reflective
   outer occlusive
   outer display
   mid-occlusive
   inner display
   inner protective Display
1. 2D screen
2. Composite Screen
   Point
      1. R-screen
   Linear Array
      1. Continuous
      2. Discontinuous
      3. Sparse
   Indirect
      1. Fluors
      2. QD
      3. Other
   R-Screen
      1. Passive
         a. Optics—TIR
      2. Active
         a. Micro-mirrors
         b. Other nano-mechanical optical elements
         c. Refractive
            i. LC
            ii. Electrophoretic
            iii. Acousto
With Advanced Visualization
1. Augmented Reality—augmented reality refers to the methods of modifying the presentation to the user based on situational factors. For example, a location/direction sensor would enable the display to present the names of stores as the user views a scene; a directional camera may be used to identify persons and display their names and other information. The examples and variations are well-documented.
2. Accommodation—accommodation refers to the focal distance of the lens of the eye. In most HMDs and digital eyepieces (video camera, for example) the apparent distance of the display is uniform and static. A common distance is 12 feet. Many digital eyepieces permit a small range of focal distance adjustment to accommodate natural aberrations in the human lens.

In the present invention, accommodation may also be dynamic, and change according the situational, user-defined, or programmed factors.

Personal displays included a broad range of configurations from screens embedded in contact lenses to handheld tablets. Many exhibit unique advantages and limitations on their utility based on factors including but not limited to weight, cost, resolution, performance, durability and suitability. For example, a large, high resolution tablet may be useful to detailed graphics, but cumbersome as a real-time navigation aid while skiing, where a micro-display on transparent goggles would be suitable.

Present technology have not solved discovered a core display technology which would be applicable to many different displays, nor has a versatile construction been invented. The present invention solves both problems and discloses a versatile display technology together with constructions of significant utility.

Figure 7A:
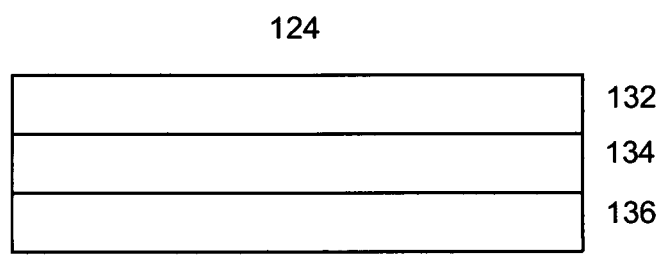
FIGS. 7A-C presents the layered construction of the viewer panels.
Figure 7B:
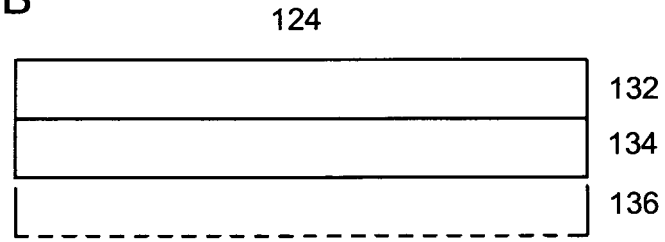

FIGS. 7A and 7b present a preferred embodiment of the display 124 of the present invention having one or more layers including but not limited to: outer protective and outer display 132, occlusion layer 134, inner display 136 and inner protective layer.

Figure 7C:
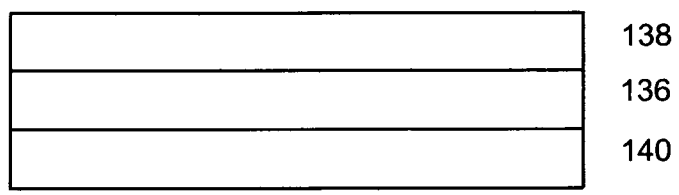

FIG. 7C present a preferred embodiment of the display 124 of the present invention having one or more layers including but not limited to: outer protective and outer reflective layer 138, display layer 136, inner reflection display 140.

Figure 8A:
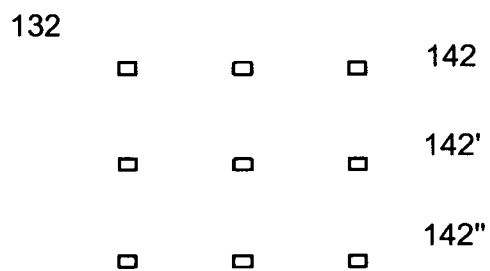
FIGS. 8A-C presents a preferred embodiment having a variable, semi-transparent viewer panel.

FIG. 8A presents a sparse emitter embodiment of the display layer 132 having emitters 142,',″ spaced in a sparse array with transparent spaces in between.

Figure 8B:
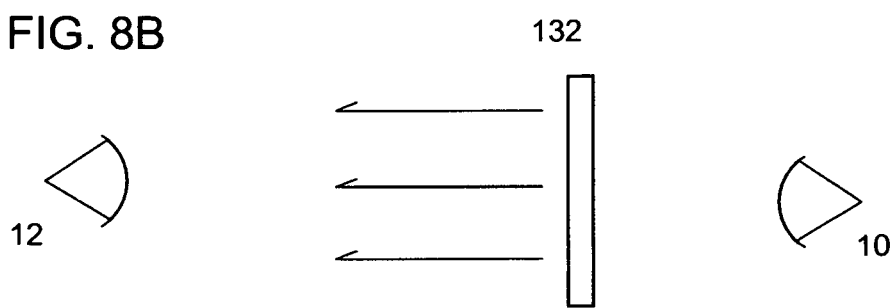

FIG. 8B presents a sparse emitter embodiment of the display layer 132 having emitters 142,',″ spaced in a sparse array with transparent spaces in between with the emitters 142 visible to an external observer 12.

Figure 8C:
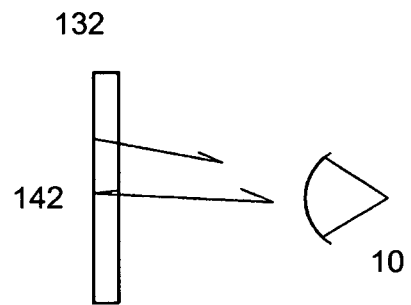

FIG. 8C presents a sparse emitter embodiment of the display layer 132 having emitters 142,',″ spaced in a sparse array with transparent spaces in between with the emitters 142 visible to an internal observer 10. Various prismatic constructions may be employed to present a larger apparent source of emission of the emitter 142.

Layers:
1. outer occlusive
2. outer display
3. mid-occlusive
4. inner display
5. inner protective It may be noted that the display layers may be edge-illuminated from a position with the relevant display illumination exiting the substrate by any fixed or dynamic optical means including but not limited to optical path prisms, holograms, TIR violations, acousto or electro-optic waveguides such as leaky or tunneling mode transition described in Sanford U.S. Pat. No. 4,791,388 and more contemporary references.

Figure 9A:
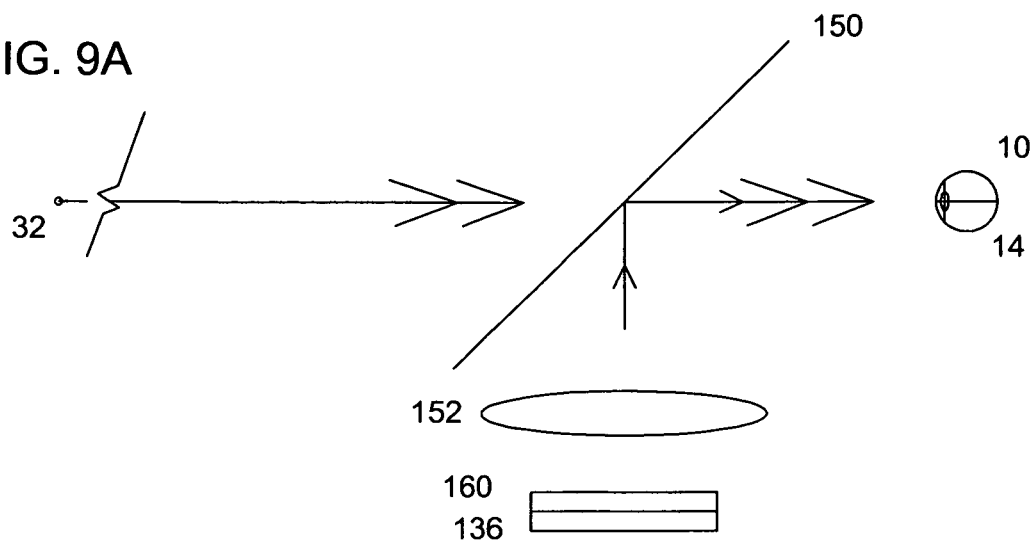
FIG. 9A presents a preferred embodiment of a augmented, virtual reality embodiment with eye monitoring and response.

FIG. 9 presents a schematic view of an augmented reality embodiment of the present invention having the user's eye 10, eye lens, 14 optical path combiner 150, external object 32, display 136 and focal-length lens 152. In a preferred embodiment, the image projected from the display 136 combines in optical path combiner 150 with the external scene 32. The user's lens 14 will normally accommodate to focus on the object 32 of attention in its field of view. In the display focal-length lens 152 may be programmed to follow the user's accommodated eye lens 14 focal length by monitoring the user's vision. This is commonly done in eye examinations and may be accomplished by a monitoring eye camera 160 in the display optical path. Monitoring may be enhanced by projecting a pattern, in visible or non-visible light on the eye generally from the display. Near IR is common wavelength used for this purpose. The preferred embodiment of the present invention presents a single, dynamic display focal length by means of the single dynamic lens 152.

This embodiment may present a programmed image and display focal length based on the design of the programmer. This image may be based on the user's eye position, eye focal length or other design factors. For example, an external camera may identify an object of interest at a distance location while the observer is focused on a near object. By programming a distant focal length together with other visual cues projected from the display, the user may be directed to the object of interest faster and with the ability to more accurately evaluate critical factors related to the object.

Programmed Global View—an entertainment, educational or other presentation may be prepared to guide the user through a real, virtual or synthetic (fantasy) visual environment by adding focal distance parameters to the scene/timeline of presentation.

Predictive Global View—Complex, predictive algorithms may be employed to program the project display focal distance based on user's actions, physiology, progression, program or other factors. A wide range of tests, evaluations and educational tools may be enhanced by this method.

Responsive Global View—The display focal distance may be based on the user's eye position, eye focal length, or other complex factors responsive the global view, including but not limited to enhancing the scene by adding realistic brightness to dimly illuminated parts of the view.

With integrated physiological monitoring (Ophthalmology and Optometry have developed a large number of tests and evaluations which may be incorporated in the physiologic monitoring of the user. The standard text: Optometry: Science, Techniques and Clinical Management, 2e, 2009 is incorporated herein by reference.

1. Lens focus—focal length of the eye's lens
2. Eye motion—saccades and other motions of the iris of the eye as well as blinking
3. Morphological Delta—both external and internal (retinal morphology)
4. Spectral Delta—distinct wavelengths may be monitored
   Ambient
   Spectral illuminated (including Raman)
   Fluorescent Illuminated (including Raman)
   OCT (optical coherence tomography
   1. Global
   2. Scanned—the present invention lends itself to scanned OCT integrated in the display projection path.
5. Doppler blood flow (pulse)

Figure 9B:
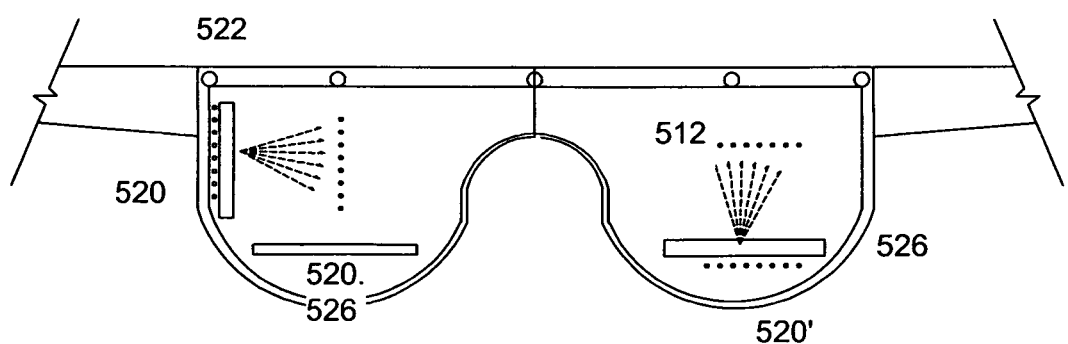
FIG. 9B references parent U.S. patent application Ser. No. 12/456,401 FIG. 5.

FIG. 9B references and retains the element numbering of parent U.S. Patent Application FIG. 5.

Wrist—HMD Additions

Wrist/Arm/Handheld Permanent base—A handheld device (smartphone) may be used as the base unit/power charger for the WristHMD/HD-HMD.

Wrist/Arm Permanent base—the wrist band may be permanent incorporating the telephonic circuitry and charging power for an low-power data-streamed HMD.

Figure 10:
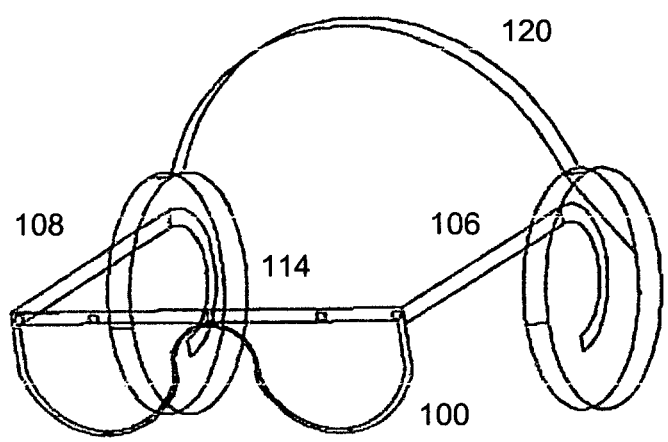
FIG. 10 presents a preferred embodiment having a pivotable frame with storage headband.

1. The Wrist/Arm band may have a permanent screen with a secondary, removable HMD appliance
2. Alternatively, the removable HMD may hold the permanent screen User Input 1. The user input may be any known method, such as but not limited to touch switches and device on the HMD frame, finger and hand gestures with gloves or to HMD mounted detectors/cameras, or eye movements monitored.
2. Innovative technologies may also be employed including, but not limited to:
   Fingers—the movement of the fingers and gestures may be monitored by a ring, knuckles, wrist or arm band with using optical variations, motion and/or vibration to differentiate the motion
   Optical Coherence Tomography (OCT) may be employed as a sensor.
3. Eye—the activity and state of the eye and eyelids may be used as input gestures
   Iris—position (fixation) activity may be utilized including but not limited to position, timing and direction of motion.
   Eyelids—activity may be utilized including but not limited to position, timing and direction of motion.
   OCT—Optical Coherence Tomography and other
4. Electro/Optical encephlograhy
5. Face muscles
   OCT on HP
Wrist/Ring Input Device—
   On thumb/wrist—"sees" fingers, surface—records sounds (taps) and Position
   On wrist—place on surface, sees fingers, records sounds
   Hears tab with Bio-change FIG. 10 presents an integrated headphones and HMD 100 embodiment where the HMD 100 may pivot about the ear and fold into a protective cover which is part of upper headband 120 connecting the individual ear speakers. The convertible frame 100 may have flexible, elastic, hinged regions 114 on the bridge, and on the arms 106, 108 which allow the frame 100 to be draped or wrapped about a curved object, including an arm, and fastened. Alternatively, the frame 100 material may be flexible. Examples include but are not limited to: elastomers, woven fabrics, linked chains, pinned segments, or other configurations.

Audience Effects

Figure 11:
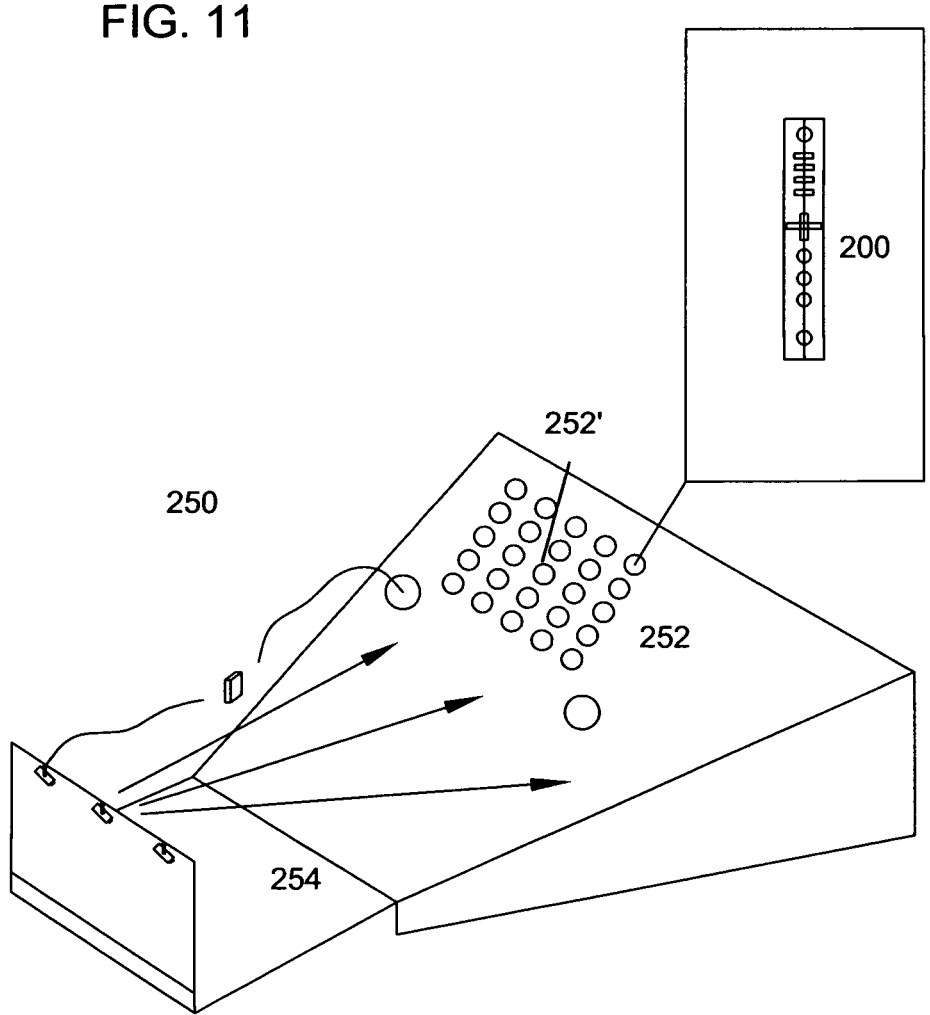
FIG. 11 presents a generalized viewer of an audience effects system.

FIG. 11 presents the generalized elements of the performance display system 250 in a venue resembling an audience 252 with a plurality of audience members 252" and stage 254. The venue may include any space ranging from the interior of an automobile, a living room, a dining hall, or nightclub to major event venues such as theatres, concert halls, football stadiums or outdoor festivals. Although the term audience unit or audience receiver unit 200 is used to describe both the simple and autostereoscopic-effects unit, it may be understood that the module may take any shape or be incorporated into any independent handheld, worn, or positioned effects device including but not limited to tickets, badges, buttons, globes, cylinders, signs, sashes, headdresses, jewelry, clothing, shields, panels and emblems affixed or held to a member of the audience or any object, moveable or stationary. The insert in FIG. 11 presents a front view of the present invention having an illuminated audience unit 200 with some or all of the elements of the audience unit of FIG. 11, as described in my U.S. Pat. No. 8,194,118, incorporated herein by reference, having one or more light emitting elements 206 which may be referred to as light emitters or modulators, light modulator, light emitting/modulator elements, LEDS, light emitter or light array, a connecting member 214, handle 212 and an active receiver 202 capable of receiving optical or acoustic signals. In operation, the show director at the control board 18 or instrument sends a sequence of commands, live or from a stored visual or audio program, over the performance system data network 14 to the projector/signal generator 100 which emits a precisely timed series of directional signals. 106, 106", 106" programmed to activate the audience units 200 at a precise location impacted by the directional signal 106. In its simplest embodiment, the projector/signal generator 100 displays an invisible IR 106 image at a specific wavelength (880 nanometers, for example) on the audience 22 which causes the wavelength-specific audience unit communication receiver 202 to activate one or more light emitters or modulators 206. The projector/signal generator 100 may also transmit a program sequence for later execution and display. Each audience unit may contain a unique encoded identifier entered during manufacture; at the time of purchase or distribution; or transmitted by the projection system to the audience at any time, including during the performance. The data protocol may included well-known communication protocols such as but not limited to IR RS-232, IRDA, Fiber Channel, Fiber Ethernet, etc. The projector/signal generator 100, referred to hereafter principally as "projector 100", may also project a visible light beam containing visual content as well as a data stream by modulating the frequency above the human visual system integration frequency of 30 Hz. It may be understood that the projector/signal generator 100 in its photonic form encompasses the simplest gobo projector as well as the most complex, integrated terahertz-modulated photonic signal generator and spatial light modulator.

The Light emitting elements 206 may refer to any type of photonic source such as but not limited to incandescent, fluorescent, neon, electroluminescent, chemical, LED, laser, or quantum dot; or to combinations of light modulating combinations such as but not limited to thin film LCDs, backlit or reflective, E*INK type reflective modulators, chemical, photonic or electronic chromatic modulators. A camera system 300 may be employed to monitor the audience and/or audience units, and provide feedback for a number of manual or automated design, setup and operating procedures. The camera system may be incorporated into the projector/signal generator unit 100. If not properly configured said data signals 106 may interfere and degrade the rate and integrity of transmission. In order to synchronize the data projectors 100, a time code signal may be transmitted from the system control board 18, a designated master controller 100. Each data projector 100 may be programmed with a calculated offset from the time-code signal based on its distance from 'center of mass' of the audience, the location of other controllers, external environment, and other factors. A central timecode beacon 140 may transmit the time-code signal to each of the data projectors 100 by means including but not limited to photonic, acoustic, or RF signals.

A feedback system from the cameras 300 may be used to adjust the performance including but not limited to projecting a fine pattern and adjusting the intensity of the data signal 106 until the appropriate resolution is achieved. The audience unit may employ an IR or other non-visible emitter for adjustment, diagnostic and other purposes. Various user input devices including microphones, buttons, switches, motion detectors, gyroscopes, light detectors, cameras, GPS and other devices may be included 216.

Figure 12:
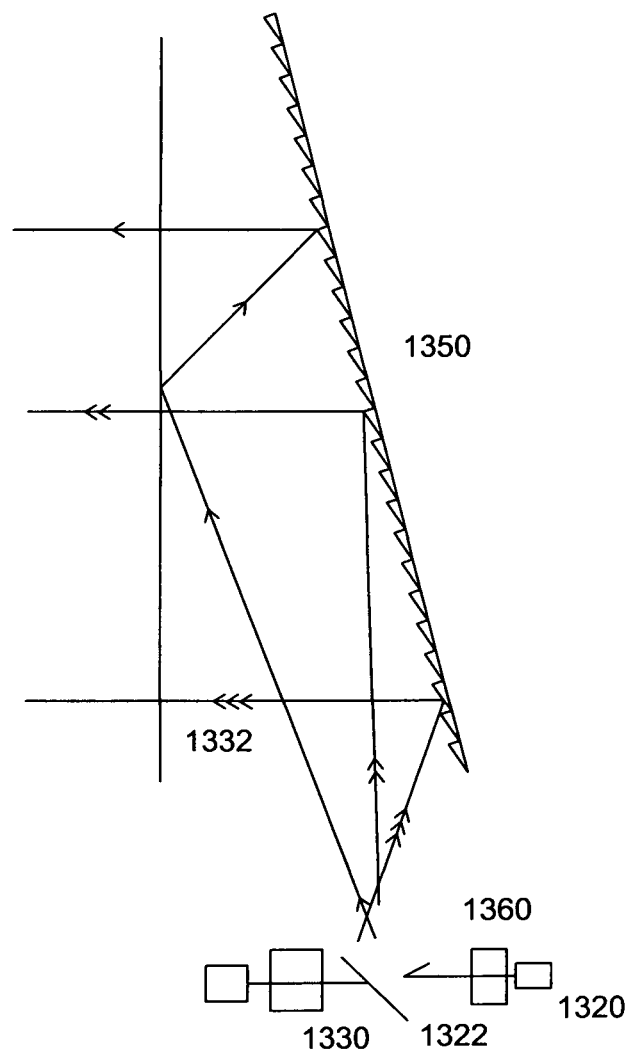
FIG. 12 presents a scanning display embodiment.

FIG. 12 presents a cross section of the translocation reflector method with a lenticular type screen. The components are an LEE array 1320, a FOE array 1360, a translocation reflector 1322, an actuator 1330, a counterweight 1332 and a position encoder 1340 and a screen 1350. In operation, a section of the full view is presented on the LEE 1320, focused by the FOE array 1360, reflected by the translocation reflector 1322 and the screen 1350. The screen may be of a fresnel, lenticular, stepped or holographic construction such as to present a focused image of the LEE 1320 to a viewer. A circular polarizing window 1360 may be placed between the observer and the screen to extinct external ambient light.

The present invention having a transparent screen layer with a holographic or diffractive grating and an occlusion layers, which were disclosed in an earlier Solomon application having a priority date of Jun. 15, 2009, may be equivalently described as a selectively transparent projection device for projecting an image toward an eye of a viewer from a projection device position in space relative to the eye of the viewer, the projection device being capable of assuming a substantially transparent state when no image is projected; having an occlusion mask device coupled to the projection device and configured to selectively block light traveling toward the eye from one or more positions opposite of the projection device from the eye of the viewer in an occluding pattern correlated with the image projected by the projection device; and diffraction patterning device interposed between the eye of the viewer and the projection device and configured to cause light from the projection device to pass through a diffraction pattern having a selectable geometry as it travels to the eye and enter the eye with a simulated focal distance from the eye based at least in part upon the selectable geometry of the diffraction pattern.

Figure 13:
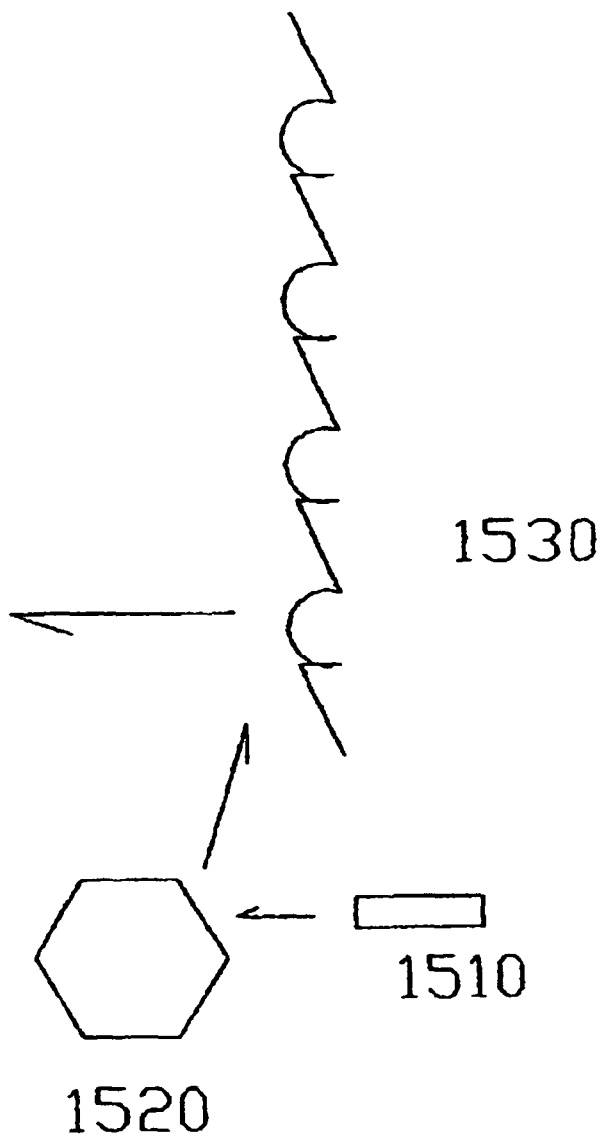
FIG. 13 presents another embodiment of a scanning display embodiment.

FIG. 13 (POLARIZED) presents a rotating polygon embodiment of the present invention. The system projects an image of the LEE 1510 by scanning a rotating reflective polygon 1520 and projecting the image onto a viewing screen or reflective micro-optic surface 1530 viewed by the observer 1540. A circular polarizing aperture 1550 may be placed between the screen 1530 and the observer 1540 and the LEE 1510 output modulated to produce a range of elliptical polarization whereby the external ambient light is extincted while the image of LEE remains visible. The LEE 1510 modulation may be used to control color and intensity as well. The LEE 1510 although shown as a single row may be constructed of multiple rows thereby projecting either a ID array of elements optically-combined for increased brightness or intensity modulation, or a 2D array. As a 2D array with appropriate spacing between elements, the optical deflection angle may be reduced to the spacing arc. This technique in combination may be used for large stereoscopic, autostereoscopic and monoscopic projection systems.

Figure 14:
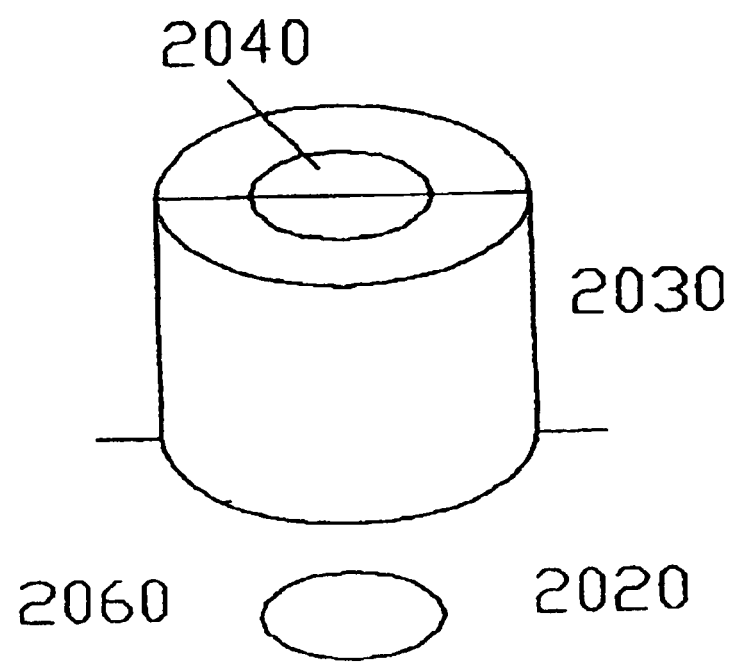
FIG. 14 presents a variable focal length lens embodiment.

FIG. 14 presents a perspective view of one embodiment of a single element of the focal distance optical element. The components are the LEE 2020, a piezoelectric cylinder 2030 and a variable optical element 2040. In operation, an electrical charge applied to the piezoelectric cylinder 2030 varies the compression of the enclosed optical material 2040 resulting in a change in the focal length of the optical element. To a viewer, the LEE will appear to vary in distance when the eye adjusts to the minimum focus. This approach requires a dark region 2060 adjacent to the focusable element for single elements, or an image edge. Focal length adjustment may also be effected by electrostatic reflective membrane arrays, gradient index liquid crystal arrays, SLMs, diffractive elements, multiple internal reflections and other known technologies.

Figure 15:
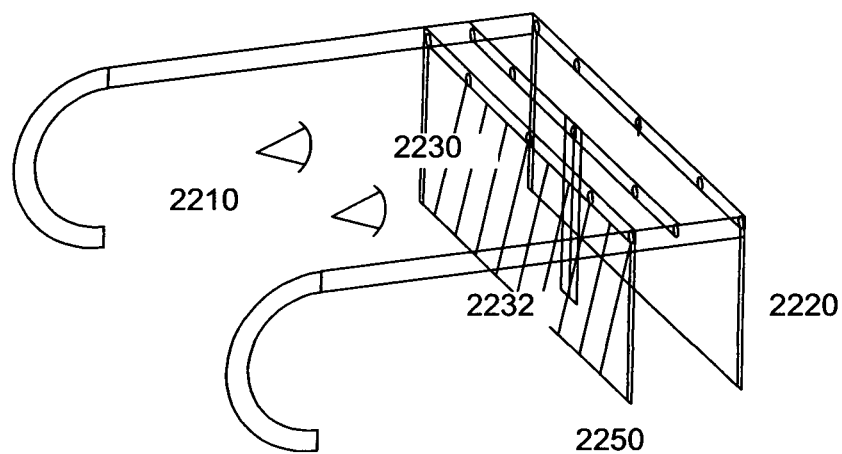
FIG. 15 presents a scanning stereo viewer embodiment using micro optic domains with a polarizing aperture

FIG. 15 presents a scanning stereo viewer using micro optic domains with a polarizing aperture. Similar to the embodiment of FIG. 21, an image is projected onto a screen 2220 from scanner 2230 or 2232 and viewed by observer 2210. A transparent polarizer window 2250 is interposed between the observer 2250 and the screen 2220. The screen may be constructed of reflective micro domains which focus the image to one observer or disperse the image for multiple observer. The beams of light from the scanner 2230 are either unpolarized or the polarization is modulated to control intensity or color.

Figure 16:
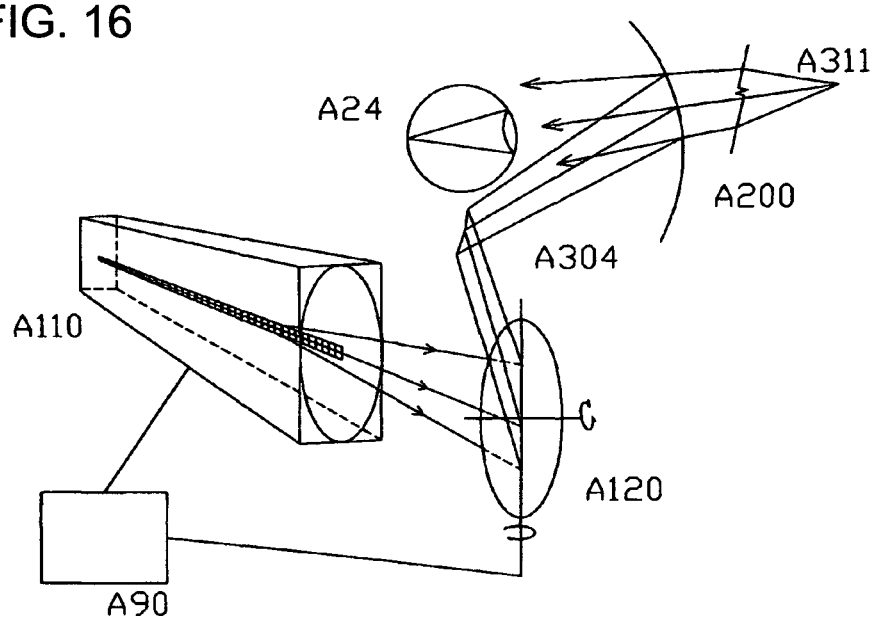
FIG. 16 shows a perspective view of the linear array, continuous focal distance embodiment of the present invention.

FIG. 16 shows a perspective view of the linear array, continuous focal distance embodiment of the present invention where the component parts of the light source and scanning assembly A100 are shown including a image computer A90, a linear array of light sources A110, and a two axis, scanning mirror A120. In operation, the computer A90 communicates with the scanning mirror A120 through an open loop drive system, closed loop position feedback or other known positioning system and illuminates those light sources A110 which correspond to the image points A310 to be displayed. The divergent beams from each light sources A110 may be focused by the eye A24 to correspond to the appropriate object distance.

While the linear array of light sources A100 is shown as an array of light emitters such as LEDs (light emitting diodes) which are driven by an image computer A90 through circuits not shown, alternative light sources may be employed. Examples of such alternatives include electronically, optically or mechanically activated emitters, shutters, reflectors, and beam modulators. Specifically an FLCD shutter array as shown in Fig., a fluorescent or two-photon emitter as described by Elizabeth Dowling, or a mechanically reflector such as Texas Instruments DMD device may be used.

In all optical systems the axial image or zero-order view may be block and the image formed from the divergent beams from the emitter.

Figure 17:
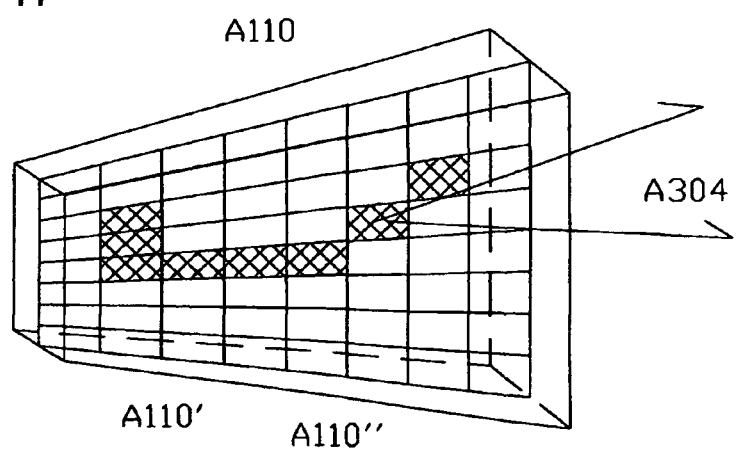
FIG. 17 presents a side view of the linear array, continuous focal distance embodiment.

FIG. 17 shows a perspective view of the 2D planar array, continuous focal distance embodiment of the present invention where a two dimensional matrix of light sources A110, A110' which produce the image beams A304. Although a multiplicity of 2D arrays A110 may be used to produce a 3D matrix full display, a preferred embodiment combines the 2D array with a scanning mechanism A120 to create the full image.

Figure 18:
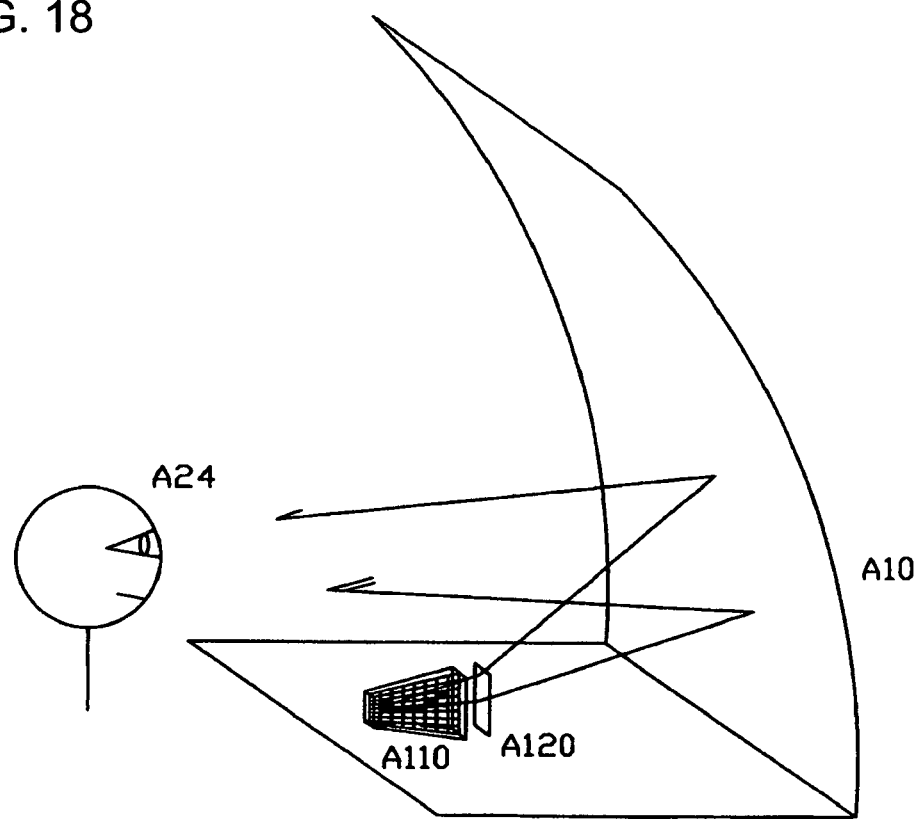
FIG. 18 presents a perspective view of the planar array, continuous focal distance, environmental embodiment of the present invention.

FIG. 18 shows a side view of the planar array, continuous focal distance embodiment of the present invention applied to an autostereoscopic display where the light source A110 and scanning assembly A120 project the beams towards the screen A200 and then to the observer's eye A24. It may be understood that the scanning assembly A120, projection optics and screen A200 may include embodiments of my previously filed and co-pending patent applications for autostereoscopic displays, thereby incorporating the present invention in the function of the light source and focal distance control.

Figure 19:
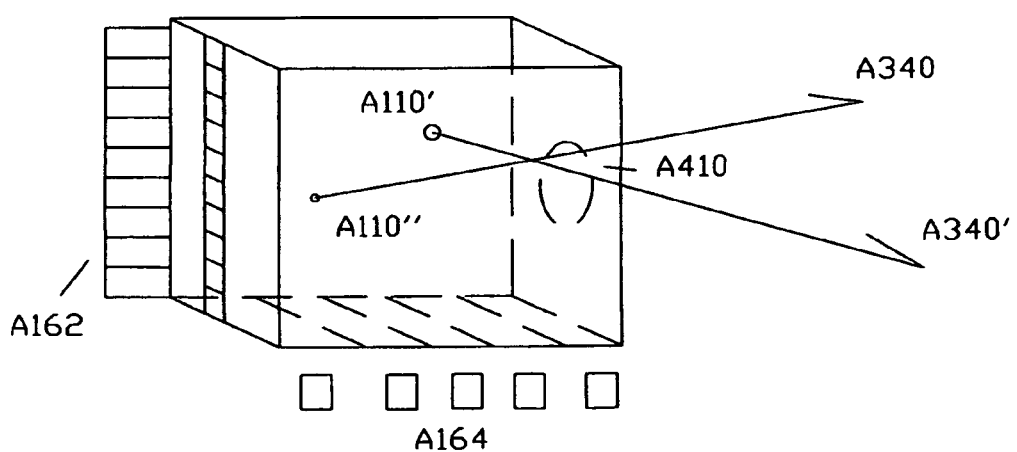
FIG. 19 shows a perspective view of a two photon activation embodiment of the present invention.

FIG. 19 shows a perspective view of a two-photon activation embodiment of the present invention. Over the past fifty years, researchers have developed a number of techniques for the photo-activation of light emitters. In recent years, Elizabeth Dowling of Stanford University has perfected a technique using a two-photon activation method. This approach may be useful employed as a light emitter in the present invention.

Figure 20:
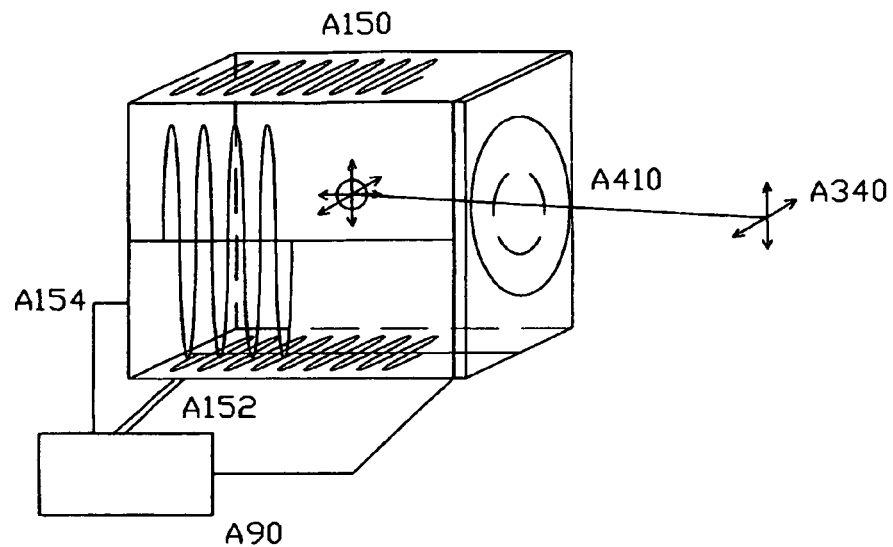
FIGS. 20 and 21 presents perspective views of a plasma activation embodiment of the present invention.

FIG. 20 shows a perspective view of a plasma or floating emitter activation embodiment of the present invention where a light emitting region where a defined light emitter region A110 is displaced in space and activated under the control of the image computer a90, the displacement field control structures A150 and the activation signal A154. The output beam A340 is structured by output optics A410.

Figure 21:
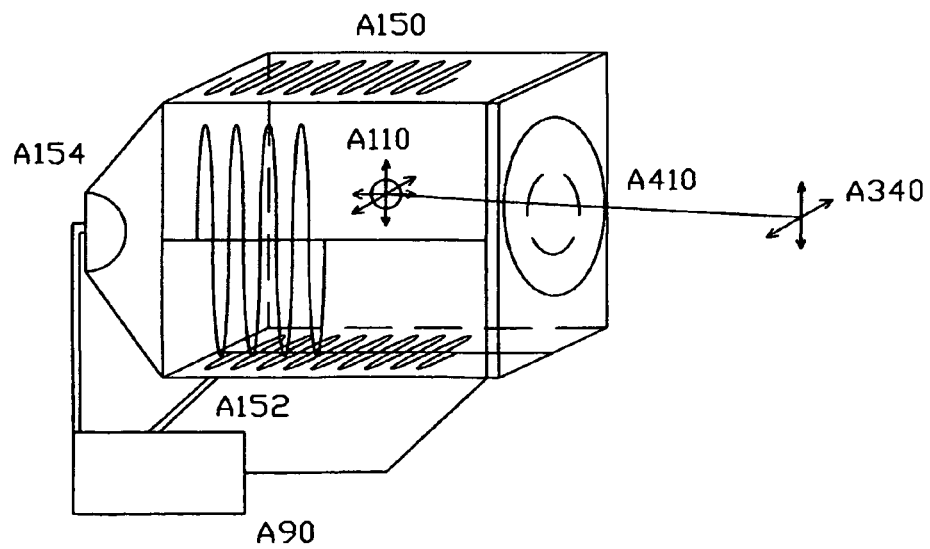

FIG. 21 shows a perspective view of the reflector or optically activated emitter activation embodiment of the present invention where a light emitting region where a defined light emitter region A110 is displaced in space and activated under the control of the image computer a90, the displacement field control structures A150 and the activation signal A154. The output beam A340 is structured by output optics A410.

Figure 22:
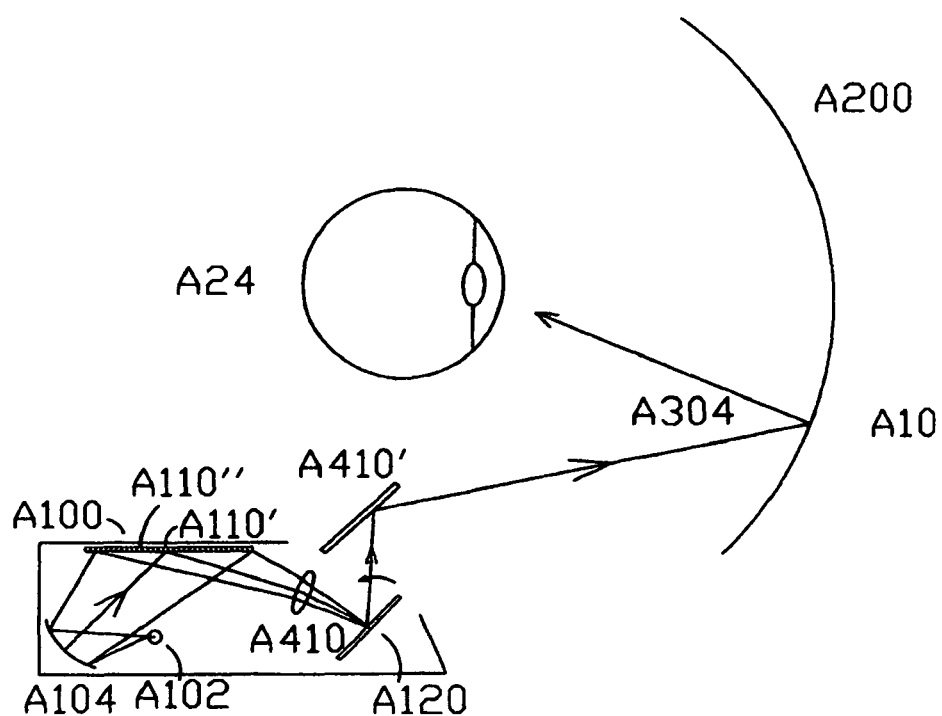
FIG. 22 presents a sectional view of a scanning embodiment.

FIG. 22 shows a side view of the angled reflective planar array, continuous focal distance embodiment of the present invention where the light source A110 and scanning assembly A120 projects the beam towards the screen A200 and then to the observer's eye A24. Specifically, a light source A102 and reflector A104 illuminate an array A110, A110', A110" shown as a section of a planar array which provides depth function for a multiplicity of image pixels. A ray A304 from the appropriate pixel A110 corresponding the depth function of the pixel is reflected to the imaging optics A410, the scanning optics A120 shown as a rotating mirror, and a reflective HOE optical element A410' which imparts the angular divergence required to present the proper cone of rays to the HOE augmented reality screen A200 and then to the observer's eye A24.

Figure 23:
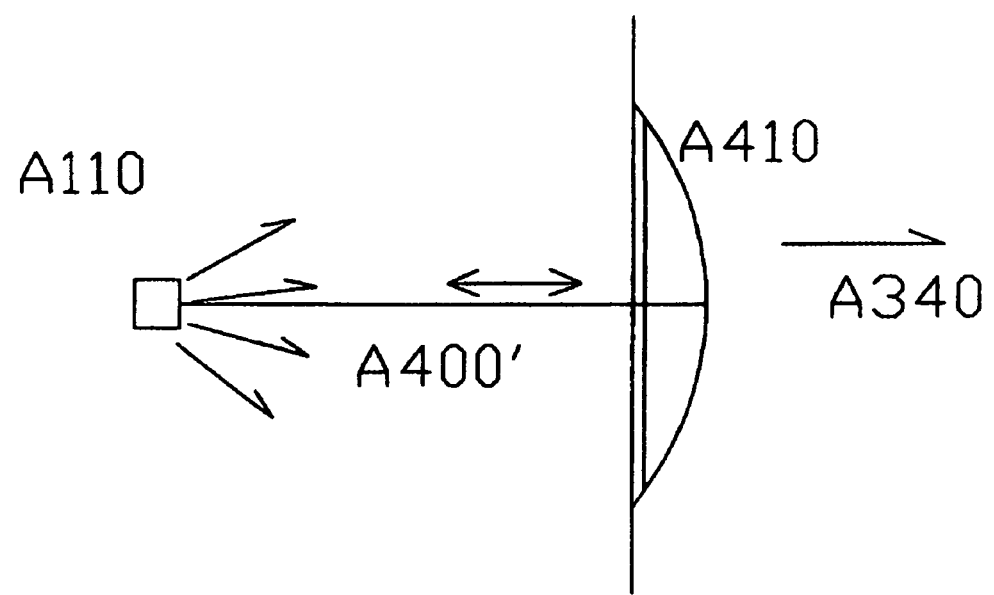
FIG. 23 presents a sectional view of a deflected, tethered light emitting element activation embodiment of the present invention.

FIG. 23 shows a side view of an improved aberration free light source and scanning assembly A10 where a light source A110 is scanned affixed to a movable member A400 affixed to a point on the plane of the projection optics A410 and the output beam is emitter about a path diverging generally along the movable member A400.

The light source A110 and movable member A400 may be chemically, electrodynamically, mechanically (physical, piezo, acousto), or optically displaced in a resonant or pixel determined fashion. Multiple light sources A110 may be affixed to the movable member A400 with intervening non emitting regions thus reducing the required displacement required. The movable member may be cyclically or predeterminably lengthen and shorten to impart a variable focal length. A multiplicity of movable members may be employed. The electronic circuits, which may be formed from transparent conductive films, are not shown. This approach may be used in low cost consumer and toy applications.

Figure 24:
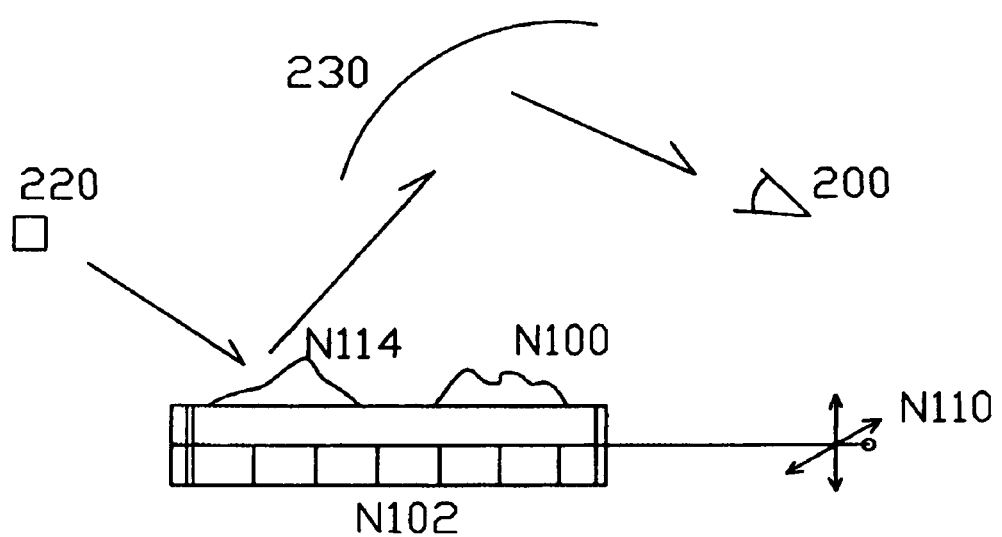
FIG. 24 presents a perspective view of a three dimensional optic deflection of apparent light source embodiment of the present invention.

The present invention optimizes the current performance/cost parameters of commercially available processes. Contemporary, medium cost, high-speed, light sources, either emitters or shutters, together with associated electronics have digital modulation frequencies in the range of 10-100 MHz. A full field display should have at least 2000.times.1000 pixels of resolution (2 megapixels) and a refresh rate of 72 Hz. The resultant data rate for a single plane, single emitter light source is 144 MHz. When 24 bit color depth is added, a digital modulation frequency must be increased by at least a factor of 8. Adding focal depth of 10,000 points, a modulation frequency of over 10 terahertz is required. Thus is it apparent that a simpler, more cost effective approach is an increase in the number of light sources. The present invention provides a direct solution to this problem. Section Two FIG. 24—Multiple Axis—presents a perspective view of a preferred embodiment of the present invention wherein the deformable membrane incorporates a pattern permitting an increased range of the redirection of the incident radiation. The structure is comprised of a deformable membrane N100 suspended above or between one or more programmable electrodes N102, which may be transparent. In one configuration, the incident beam N104 is reflected from the membrane N100 towards the visor mirror 230 and observer's eye 200. In operation, the control electronics N110 applies a variable charge to electrodes N102 causing a localized deformation N114 of membrane N100. The amplitude and timing of the applied charge may cause the localized deformation N114 to travel about membrane N100 in a vector or raster pattern. the deformation of membrane N100 is synchronized with the modulation of LEE 220 causing a specific image pixel to be illuminated. The pattern may simultaneously control the spatial distribution and the wavefront of the beam, creating the impression of a variable focal distance with spectral and $3.^{rd}$ and $5.^{th}$ order optical aberrations corrected. The membrane N100 and structure may be mounted upon a translocatable, movable or resonant structure to further enhance its range and applications.

The membrane may be lateral or other incisions/discontinuities for a linear translocation.

Heterogeneous chemical and mechanical domains in the membrane may be included and individually activated by photonic, mechanical, magnetic or electronic means.

Figure 25:
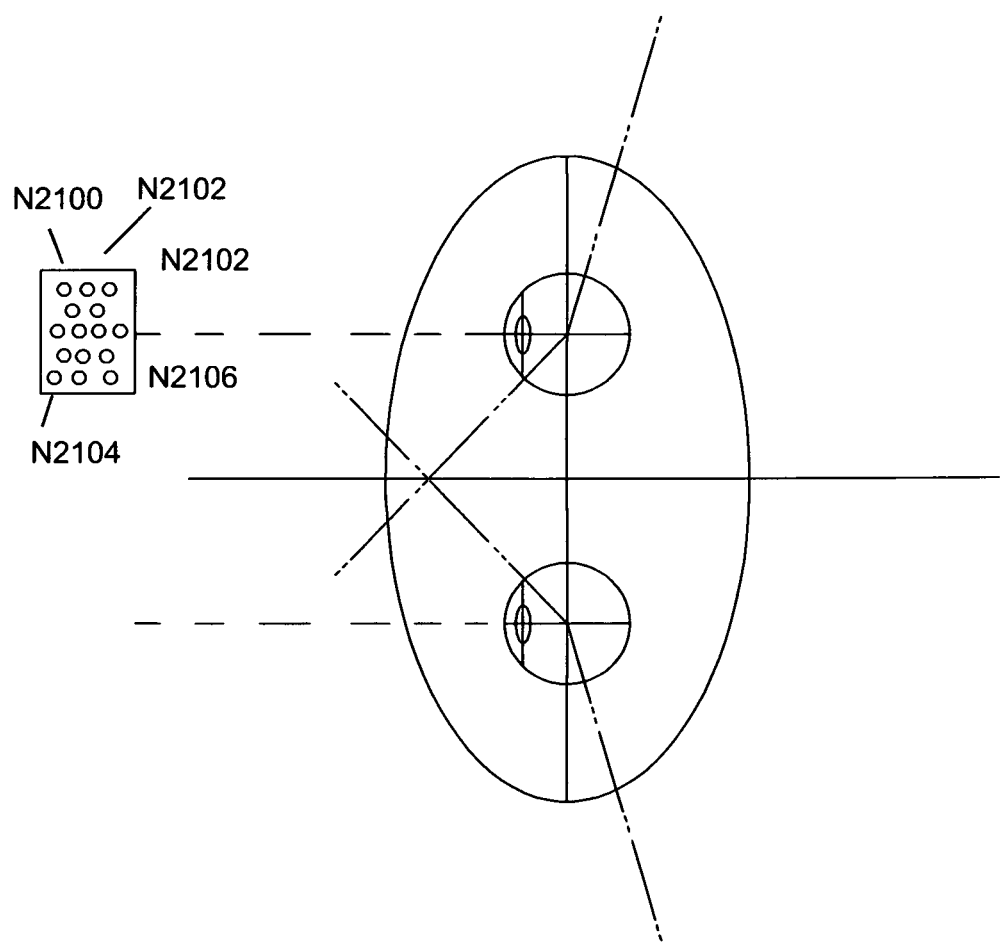
FIG. 25 presents an interneural motion embodiment of the present invention.

FIG. 25 Interneural Motion Processing—presents a preferred embodiment of pixel pattern N2100 containing multiple pixels N2102 which are illuminated simultaneously or with discrete recalculated intervals. While the human retinal captures photons in microseconds, processing by the retinal neural system imparts a time course which acts to enhance or inhibit adjacent biological vision pathways. A single scanned photon may when illuminated at a certain frequency induce the cognitive visual impression of motion in the opposite direction. At a image level, this is observed in the spoked wagon wheels of older Western films. At the biological level, the result may be confusing and ambiguous, thereby substantially reducing a fighter pilots response time, for example.

Many image processing systems compute the next image well in advance of the 72 hertz visual refresh rate and may extrapolate images to include the intensification of certain pixels N2104 or the reduction of other pixels N2106. When correlated to visual field speed, this enhances the observers response. Reference: USAF Advanced Flight Cockpit Study, MIT, 1997.

Figure 26:
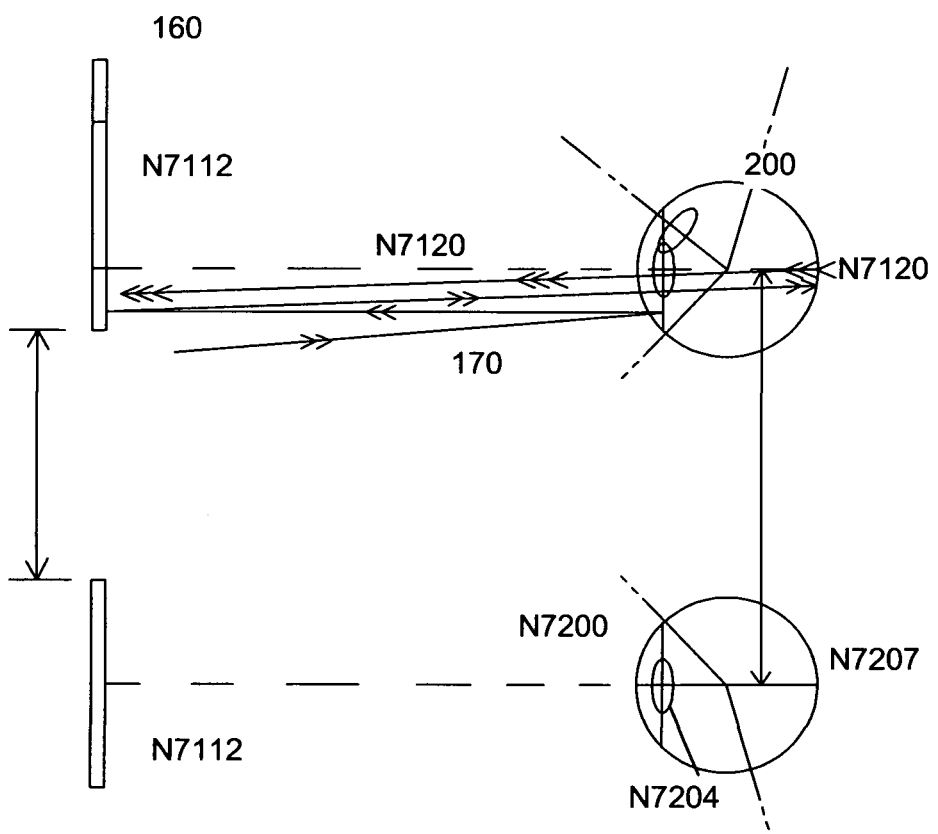
FIG. 26 presents a dynamic interocular display embodiment.

FIG. 26—Interocular and Retinal Distance, Shape and Range of Movement—presents a preferred embodiment incorporating the dynamic interocular distance and orientation control. One method of alignment and orientation of immersive displays employs one or more test patterns which provide the observer an alignment or adjustment reference. Standard tests for image position, focal distance and stereo alignment may be incorporated in manner similar to adjusting a pair of binoculars or stereomicroscope. Additional tests which incorporate dynamic motion and require hand-eye coordination may be included.

In the present invention, two complementary improvements are employed which permit dynamic adjustment. The first part measures the range of eye motion of each eye by recording the limited of the iris movement. The second parts the range of retinal image focus and position by projecting a visible or invisible test image and recording the dynamic changes of eye position and focus.

This is accomplished by monitoring the eye state by means of a reflected beam N7120 and a reflected image detector N7112 which may range from a single photodiode to a full color hi-speed camera. An incident beam 170 which may be visible or invisible is reflected from the iris N7200, the retinal N7202, or the eye lens N7204. Spectrographic analysis may be used to identify the source of the reflected beam.

The control computer 160 receives the data from the image detector N7112 and other external systems including the interocular distance which is either fixed or includes a known measuring detector (not shown). This provides sufficient information for the calculation of the orthogonal visual axis of the immersive display relative to the observer and permits an adjustment of the display image including apparent focal distance, stereo image disparity, and visual axis orientation.

This dynamic adjustment may be useful convenience for all users and of crucial importance to fighter pilots and other environments where high stresses may cause a physical displacement or distortion of the display or body morphology. An test example for dynamic control would measure the retinal shape and curvature by monitoring the focus of a scanned point in a single photodiode detector system or the width and curvature of a line with a two dimensional detector array. Dynamic monitoring of retina would correct for G forces and other anomalies during high speed turns by fighter pilots and astronauts.

Additional external eye state systems such as are manufacture red by ISCAN, Inc. may be employed and the data integrated by the control computer 160.

Figure 27:
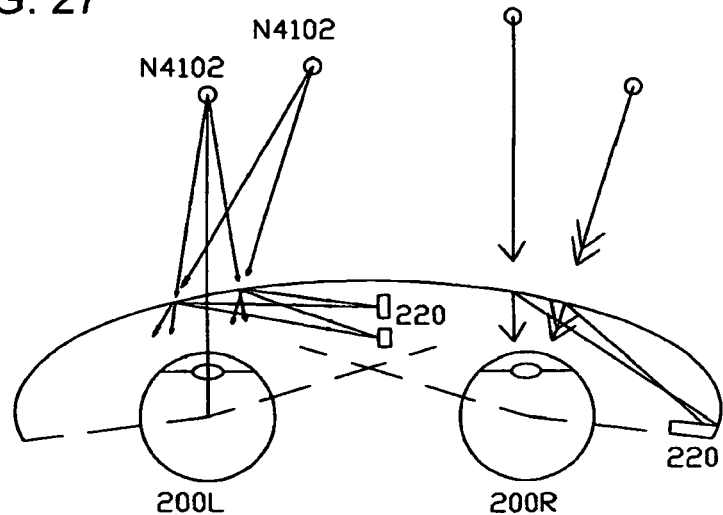
FIGS. 27 and 28 presents a top view of a transfer reflector embodiment.

FIG. 27—Distant Focus—presents a preferred embodiment wherein a fixed focus length is set by multiple horizontal elements which are vertically scanned. Other orientations may be employed. Alternatively as shown in FIG. 4A, one or more emitters 220 may be used in a scanning system. In this FIG. 4 emitter may include the other optical emitter group components including variable focal length. The left eye 200L observes a virtual image at point N4102. The right eye 200R observes a image set at infinity. While the relative position of point N4102 in relation to the left eye 200L is important, it is less so in the infinite focal length example. With all image points being compressed into the infinite plane, image object occlusion disappears. A object only viewed through an aperture would still be subject to minor occlusion at a global scale The variable focal length faculty of the present invention may be exploited to permit global or sectional virtual screen at a fixed focal length—with or without correct stereoscopic image disparity. This technique may be used for medical and performance diagnostic, data compression and reduction as well as all other purposes. A virtual screen set beyond the normal accommodative limits of the human eye (approximately 400 meters through infinity) may be minimize the impact of incorrect stereoscopic interocular alignment. Under these circumstances, the projected cone of rays emanating from each pixel need not illuminated the entire pupil travel domain but may subtend the solid angle from the general region of the image object.

Figure 28:
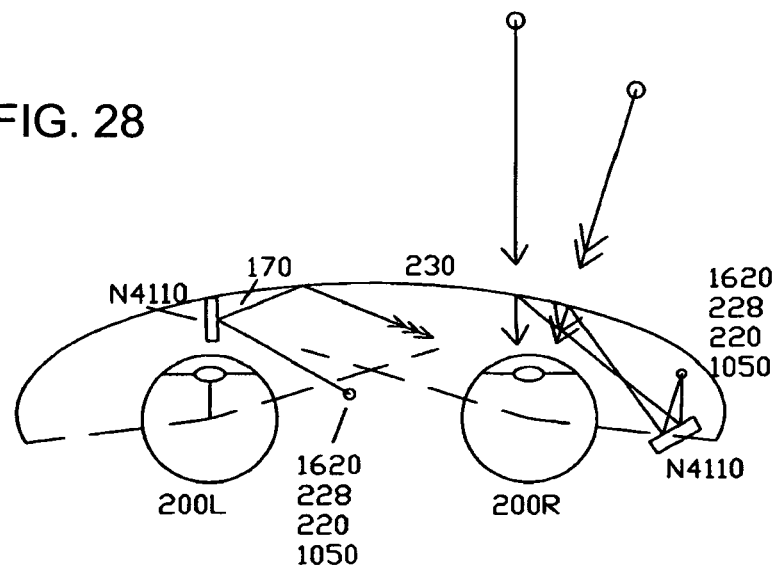

FIG. 28 shows a representative example where an intermediate transfer reflector (or transmitter) N4110 is employed. The beam 170 exits the optional focal length control 1620 if employed and is reflected (or transmitted) by intermediate transfer reflector (transmitter) N4010 towards the visor reflector 230 and to the observer 200. The reflectors may be positioned in any location or combination including but not limited to above and below the eye plane, across the field of vision, at the periphery or the center.

Figure 29:
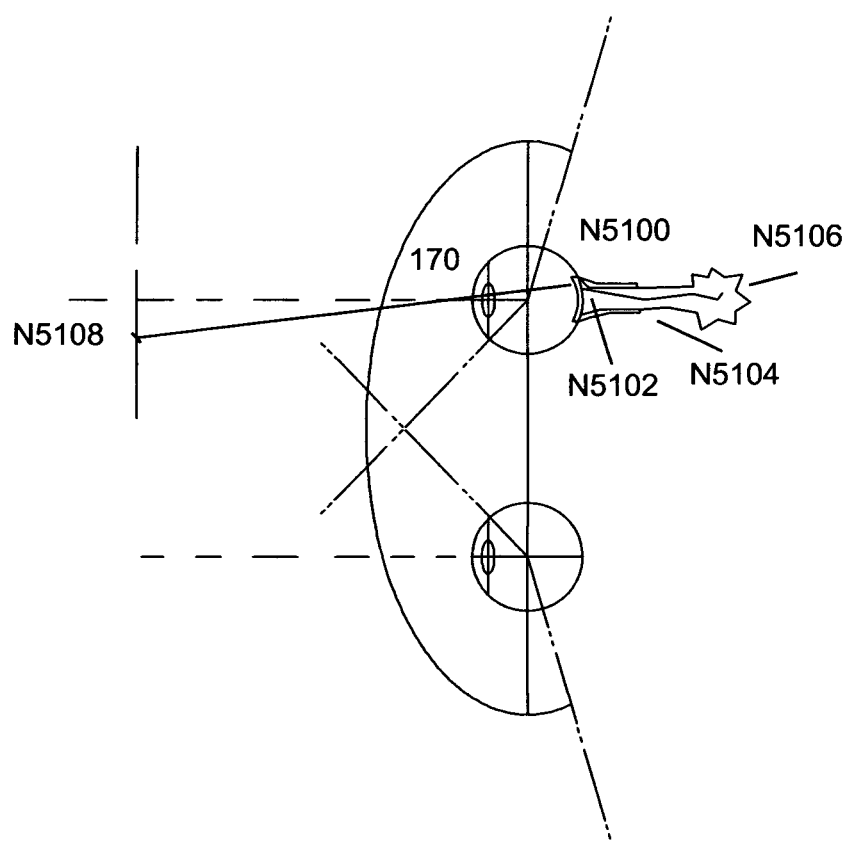
FIG. 29 presents a photonic inductin of nerve transmission embodiment.

FIG. 29—Induction of Vision—The use of photonic induction of nerve transmission has been disclosed by the author in previous U.S. patent applications and papers. The preferred embodiment of the present invention discloses a method and apparatus for the direct photonic enervation of the human visual system.

It has been shown (Salzburg, 1979, this inventor and others) that the state of a neuron may be monitored optically. The reverse process is also true. The preferred embodiment incorporates the disclosed optical system in a novel way. A retinal implant N5100 receives the beam 170 which causes a localized nerve depolarization N5102 sending a signal N5104 to a brain image location N5106. The user may then identify the location in the viewer's reference (imaginary) which may or may not correspond to the virtual spatial source of the beam N5108.

The difference is received and computed by the processing computer 160 to generate a viewer's lookup table which permits a mosaic image to provide a correct view for the individual viewer's cognitive vision.

The retinal implant N5100 is the subject on the inventor's previous and pending applications and papers. The process may be used on sense, motor and aural nerves as well where processing computer 160 receives the instructions from the users biological process (Solomon, 1979) or other control systems and generates a mosaic image to activate the implant N5100.

Figure 30:
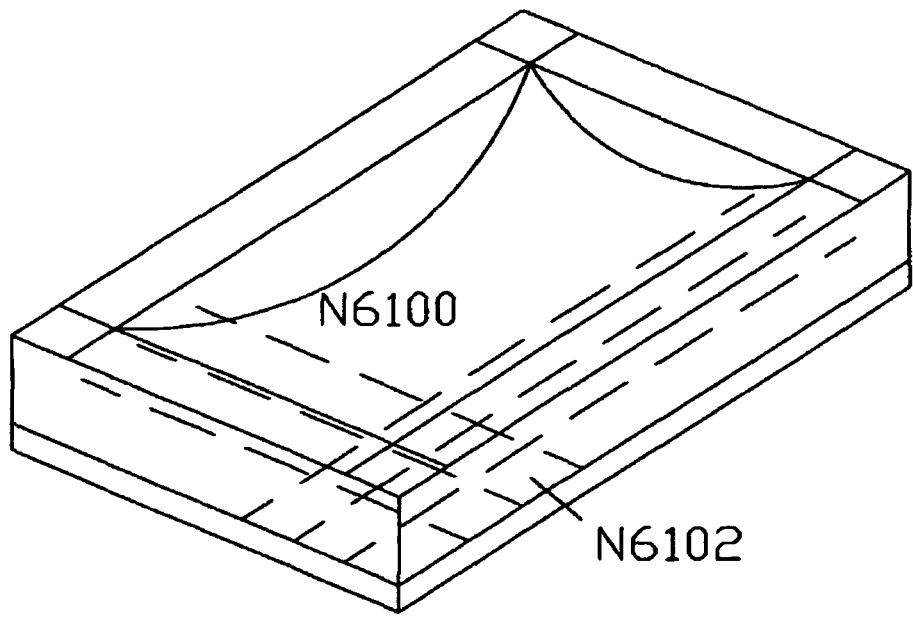
FIGS. 30 and 31 presents a preferred deformable mirror membrane embodiments of the present invention.

FIG. 30—Variable Membrane Tension—The use of variable shape reflective and transmissive materials such as reflective membranes, transmissive liquid lenses, and materials wherein a localized change in refractive index is induced for beam forming and scanning are well known. In a preferred embodiment of the present invention these materials are utilized to vary the focal length and beam direction in a novel construction, using both integrated and multiple elements.

In FIG. 30, an elongated concave membrane N6100 with multiple electrodes N6102 is shown. The membrane N6100 is shown connected at the corners but any configuration may used. The membrane may be in tension flat or designed with a distinct neutral shape.

Figure 31:
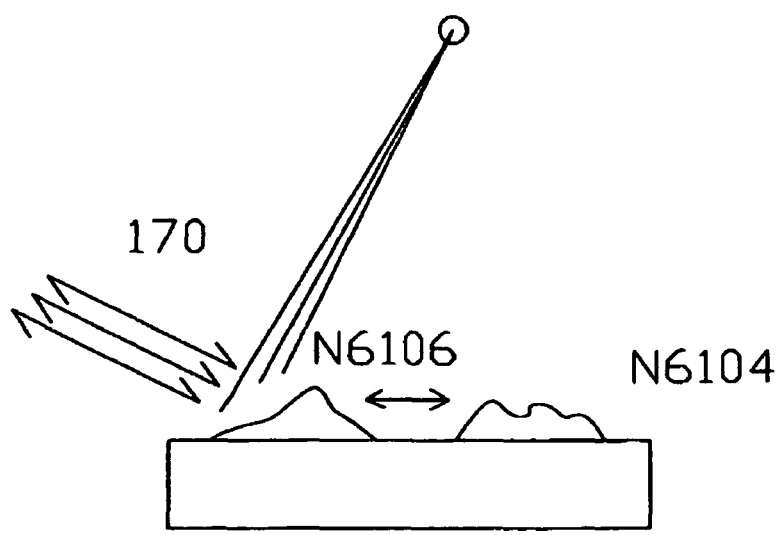

FIG. 31 shows the operation wherein a shaped portion N6104 of a convex membrane N6100 oscillates between alternative positions N6104 and N6106 during a view cycle of approximately 72 hertz. The beam 170 is reflected from the surface. During each cycle the membrane undergoes a multiplicity of subtle changes which reflect the integration of the field forces generated between the multiple electrodes N6102 and the membrane N6100. These changes are controlled by the processing computer 160 and incorporate the focal length and beam direction information.

It is understood that the membrane may represent the surface of deformable or refractive index variable, transmissive material using transparent or reflective electrodes at surface N6102.

The use of deformable membrane mirrors as a method for controlling the beam direction, the focal length, the modulation of intensity and chromaticity and the correction of errors has been the subject of extensive research. In Applied Optics, Vol. 31, No. 20, Pg. 3987, a general equation for membrane deformation in electrostatic systems as a function of diameter and membrane tension is given. It is shown that deformation varies as the square of the pixel diameter [a] or voltage [V], and is inversely proportional to the tension [T]. In many applications were the invention is proximal to the human eye, increasing the pixel diameter or the voltage is impractical. Consequently, dynamic changes in membrane tension offer an acceptable method for variation. Variable membranes utilizing known mechanical, photonic, acoustic and magnetic deformation may be employed.

Figure 32:
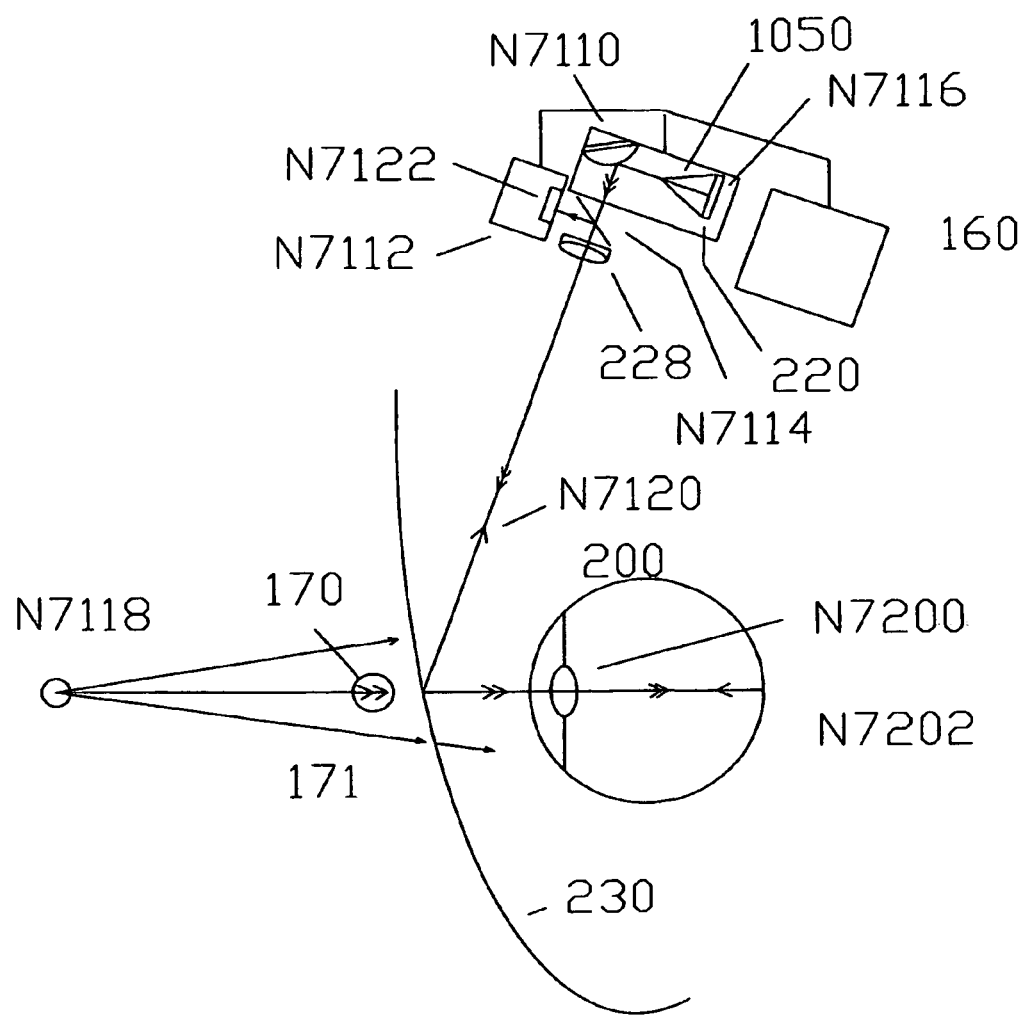
FIG. 32 presents a preferred embodiment having a focusable element.

FIG. 32 shows the preferred embodiment as disclosed in related government proposals wherein the display system is comprised of a processing computer 160 which coordinates the illumination of LEEs 220, the modulation of display beam integrated translocation and focal length component N7110 and the eye state feedback component N7112. In operation, the light emitted from LEEs 220 is combined the optical waveguide 1050 and directed as a discrete beam 170 to the translocation and focal length component N7110. The beam 170 is directed and focused towards the beam splitter N7114, an optional conditioning optic 228 which may be positioned at any point between the exit aperture of the optical waveguide 1050 and the visor reflector 230, and the visor reflector 230. The beam 170 is then directed to the viewer's eye 200, presenting a replica beam of that which would have been produced by a real point N7118 on a real object 100.

Under normal illumination, a real point N7118 would generate a cone of light whose virtual representation is beams 170 and 171. The observer will perceive the object point N7118 as long image beams 170 or 171 enter the observer's iris N7200 at a viewable angle.

A reflected beam N7120 is recorded by the eye state feedback component N7112 which incorporates a detector and conditioning optic N7122 which may range from a single photodiode to a complex, hi-speed, full color camera.

Data collected by the eye state component N7112 may be received and analyzed by the processing computer 160.

The preferred embodiment of the present invention may incorporate a membrane structure which dynamically and reversibly changes tension in response to applied field, charge density and photonic irradiation.

Figure 33:
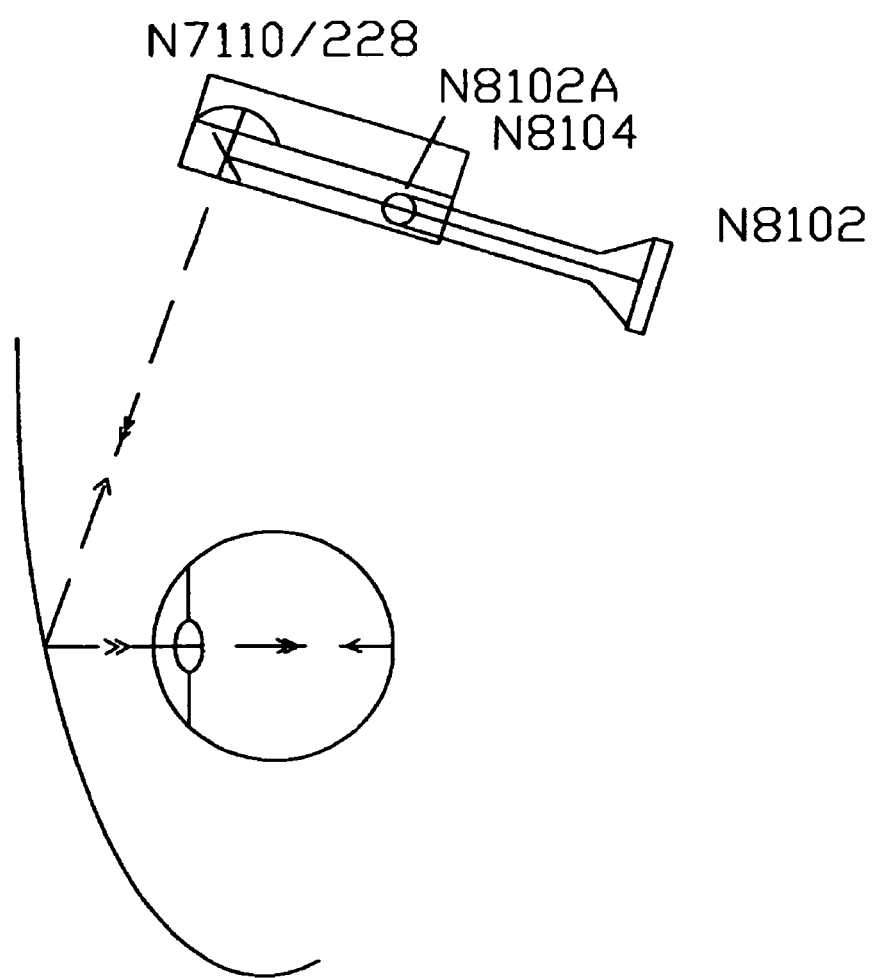
FIG. 33 presents a preferred embodiment having a fiber optic element.

FIG. 33—Fiber optic transfer of emitter aperture—presents a preferred embodiment wherein the emitter and combiner exit aperture N8102, N8102A is transferred by means of an optical waveguide N8104 to the focal distance optical element N7110 or projection optics 228. Various shapes of waveguides including micro-optical elements may be employed.

It may be understood that the present invention may be applied to alternative constructions, orientations, spacing, and shapes including but not limited to horizontal, oblique, curved or discontinuous arrays and scans.

In the present invention, the intensity of the light source may vary during the cycle maximum of 8 periods by the binary increments of 1, 2, 4, 8 . . . . Each pixel is illuminated for 0 to 8 periods resulting in varying intensities of 0-255 and an individual pixel density increase of a factor of 4. The base two series may be expanded to any power.

Figure 34:
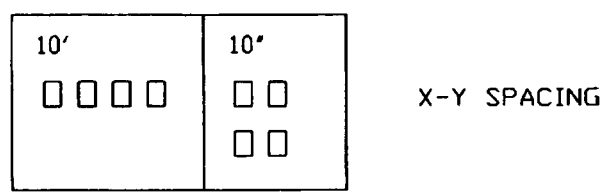
FIGS. 34 and 35 present a preferred embodiment having a offset reflector.
Figure 35:
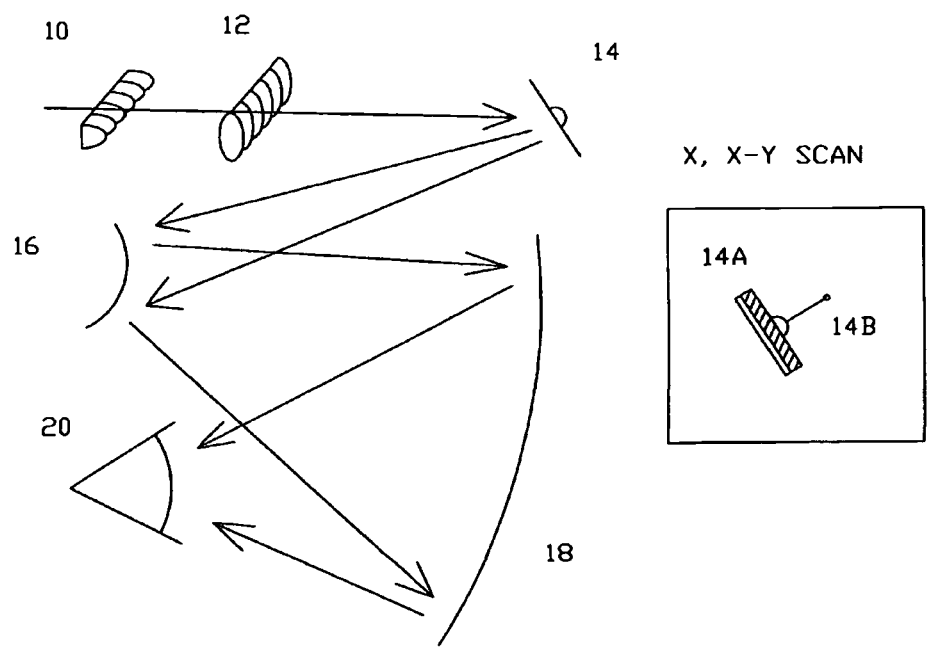

Additions: Composite Linear Array Having:
pixel LEE driven analog
pixel LEE driven digital
group pixel LEE driven analog
group pixel LEE driven digitally
additive
binary intensity sequence
with integrated color
with distinct color
vertical scan
horizontal
with TIR visor optic
color separation
image enhancement
by F/LCD shutter
by static directed prismatic
variable ambient occlusion
forming TIR layer
with separator from TIR
integrated eye-tracker
horizontal FDOE
vertical FDOE
With TIR Screen
With FDOE enabled
With FD corrected for TIR
with dynamic HOE visor optic
HMD with image generated in ear arm and optically bent by TIR at the arm-visor junction
HMD as Personal Communicator
HMD with Dynamically Focusable Transmissive External View Lens FIGS. 34 and 35 show a preferred embodiment having a light source 10, variable focal length element 12, a first scanning element 14, a first optical element 16 and a visor optical element 18. In operation, the light source 10 is focused by focal length element 12 and scanned by scanning element 14 onto the first optic 16 and then onto the visor optical element 18. The first optical 16 causes the virtual position of the light source to displace, which is expanded by the proper complementary visor optics as viewed by the observer. This embodiment expands the visual aperture of the HMD.

Complementary optics includes various combinations of circular, parabolic, and elliptical forms. One example shown is a circular first optic 16 and an elliptic visor optic 18. Corrections for 1$^{st}$ and 3$^{rd}$ order aberrations may be introduced. Factors such as field of view, precision, scanning control and light source modulation may determine the optimum design for a given market.

Eye position feedback may be used to adjust the image for placement, registration with the external environment, or distortion.

Figure 46:
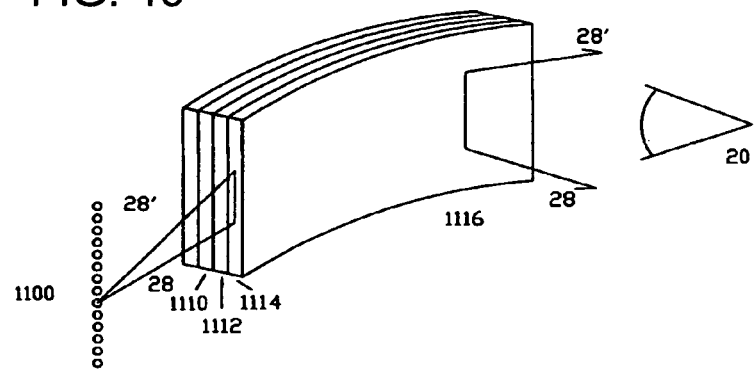
FIGS. 46 and 47 presents preferred embodiments having thin-film optics.

The embodiment disclosed in FIG. 46 is described in large part in my earlier and pending applications, which integrate the scanning and first optic properties by displacing the reflective surface of the scanning element 14, which may be but is not limited to a resonant mirror, from the axis of rotation. This naturally occurs with a polygon scanner.

It may be noted that the observer aperture is determined in part by the relative size of the light source aperture (pixel) and the virtual position displacement caused by the scanning optics. Thus, a wide observer aperture dictates a small light source and a larger virtual displacement.

Figure 36:
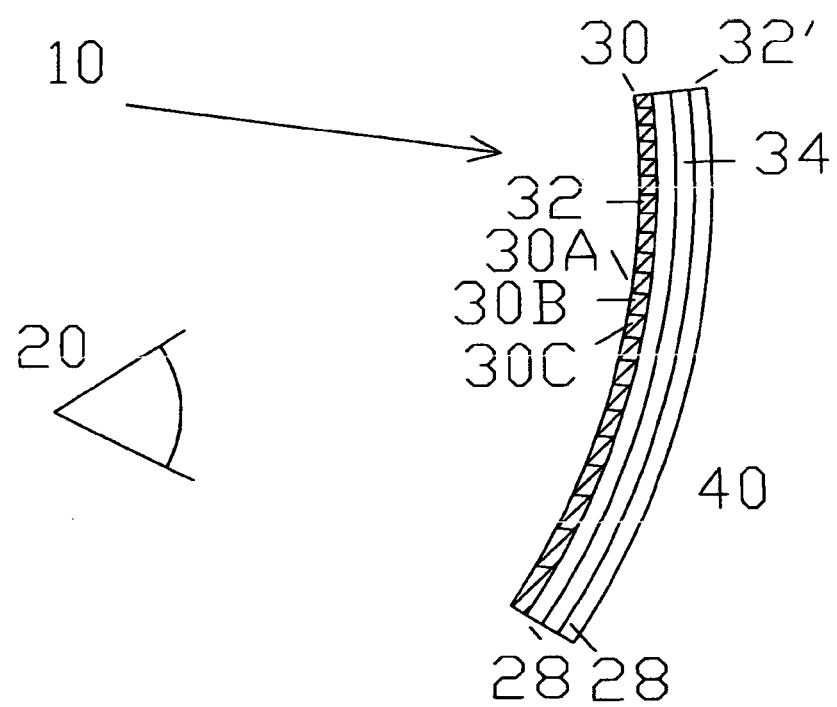
FIG. 36 presents a preferred embodiment having an active, augmented reality visor.

FIG. 36 shows a preferred embodiment having an active, augmented-reality visor optics 28 having a reflective prismatic form 30, a liquid crystal medium 32 and an external substrate. In operation, the reflective forms 30*a-c* are sequentially switch from reflective to transmissive in coordination with the scanning of the light source 10. The ratio of reflective to transmissive periods determines the occlusion of the ambient environment. A second liquid crystal and substrate 40 may be employed to increase the occlusion of the ambient environment. The polarization optics for occlusion are not shown, but commonly understood in sequential shutter stereoglasses such as those used by IMAX or manufactured by Stereographics.

The active visor optics 28 complements and may be applied to the embodiments in my pending applications.

Figure 37:
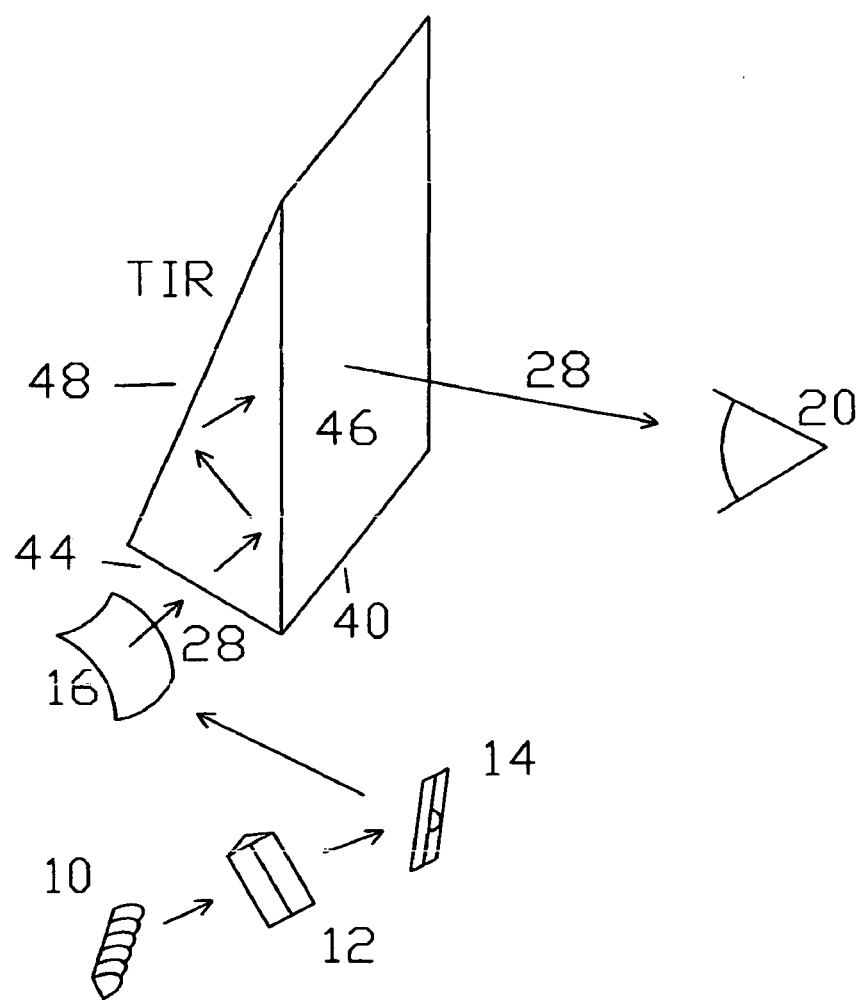
FIGS. 37-45 present preferred embodiments having a total internal reflection.

FIG. 37 shows a preferred embodiment applied to the Johnson art of total internal reflector where the beam(s) 28 from one or more light sources 10 including but not limited to a linear array are modified by a focal length element 12 and scanned by scanner 14 which may included a displacement reflector 16 into the Johnson prism 40. With the prism 40, the beam is totally internally reflected one or more times between the exit face 46 and the prism face 48, finally exiting when the intersection with the exit face 46 is more than the critical angle, to the observer 20. A redirecting optical element 60 is shown in FIG. 4 which may be diffuser, fresnel lens, micro-optic lens, HOE or other optical element depending on the use, (HMD, NTE, heads up display, screen) and position(s) of the observer(s).

Figure 38A:
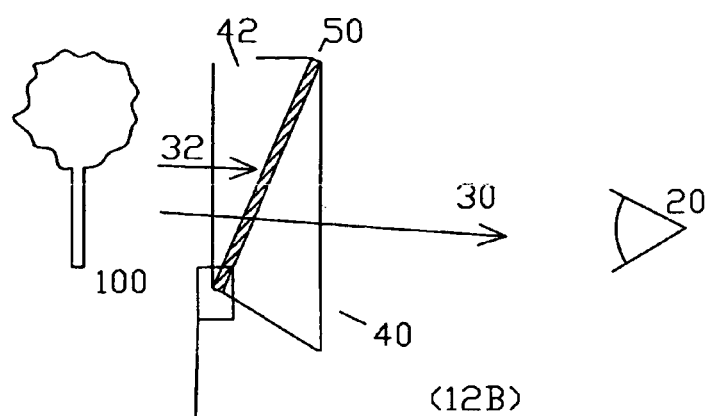

FIG. 38A shows a second prism 42 proximal but spaced from the first prism 40 which directs the light from the environment 100 through the first prism 40 to the observer(s) 20. Interposing between the prisms is a shutter system 50 (which may be but is not limited to liquid crystal shutters, electrophoretic, electro-optic, MEMS or other systems) configured and activated as rows, columns or both. In operation, the shutter acts to occlude the external environment 100 and increased the contrast of the projected ray 30. The shutter 50 may act in synchrony with the scanning system 14.

Figure 38B:
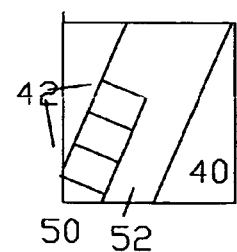

FIG. 38B shows that the shutter system 50 may be placed next to the second prism 42 with a space 52 between the shutter and the first prism 40. When used with LCD, electro-optics or acousto-optics the change in the refractive index may alter the critical angle or reflectivity, or evanescent coupling, thereby increasing resolution and contrast. Alternately, the shutter system 50 may be spaced from both prisms.

Figure 39:
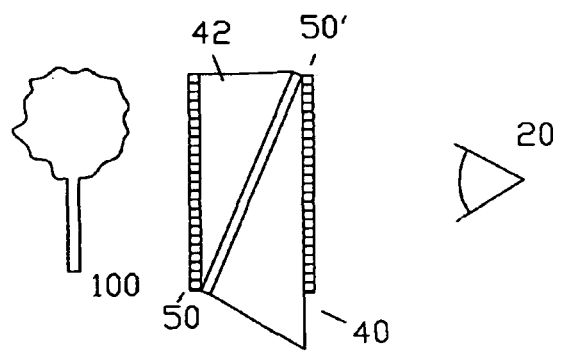

FIG. 39 shows that the shutter system 50 may be able to the observer face 50' or the environment face 50.

Figure 40:
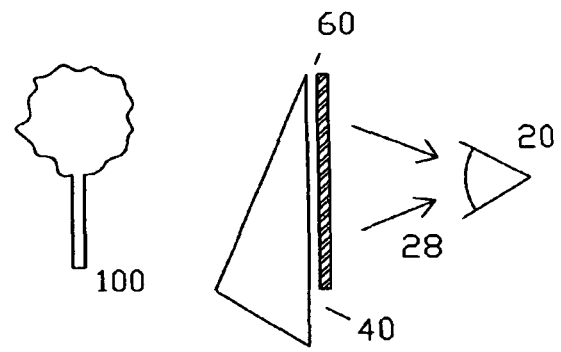

FIG. 40 shows a redirecting optical element 60 which may be diffuser, fresnel lens, micro-optic lens, HOE or other optical element depending on the use, (HMD, NTE, heads up display, screen) and position(s) of the observer(s).

Figure 41:
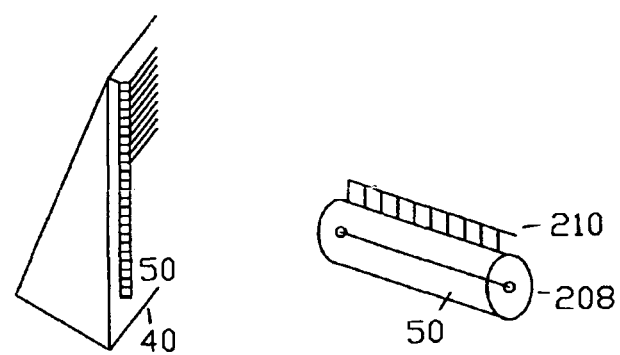

FIG. 41 shows a method of manufacturing the linear array shutter system where the shutter material (LCD, for example) 50 is applied to a film which is placed on roll 208 and serially sliced 210 (etched by laser, for example.)

Figure 42:
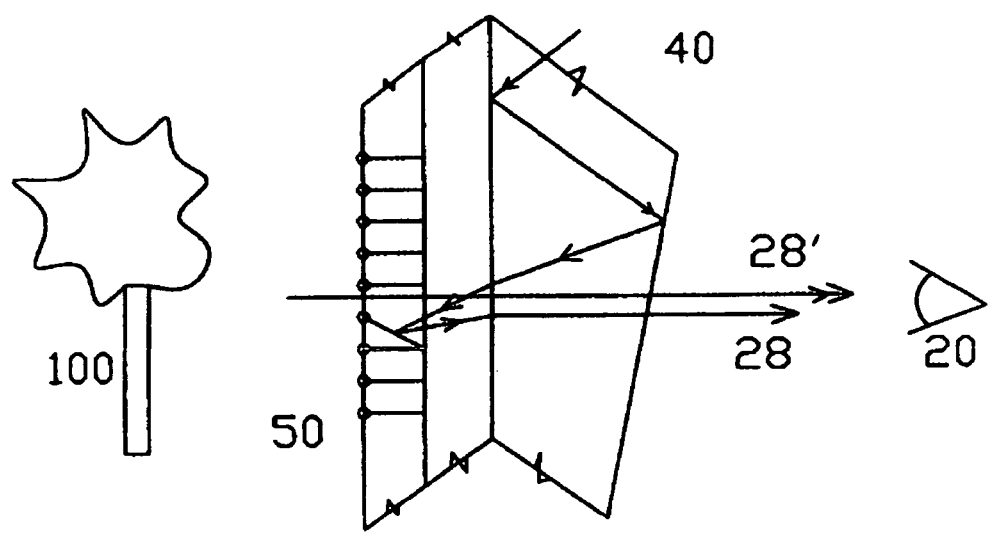
Figure 50:
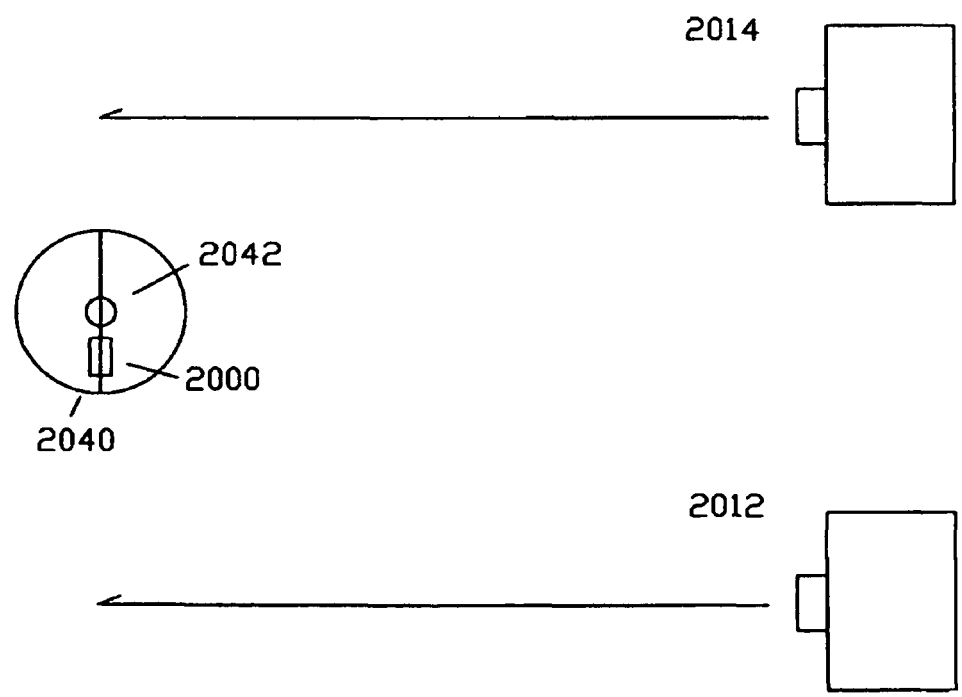

FIG. 42 present an active shutter reflector element 50' which may function as the redirecting optics 1350 as shown in FIG. 13 and FIG. 50, one or more shutter systems 50, 50' may be incorporated with a redirecting optic 60 placed before or after. When the shutter system 50' is in between the observer the prism exit face 46 it may additionally function to increase the resolution, shown as vertical lines but not limited to any direction, of the beam by masking the adjacent regions 50*a, b, c*, when opened in synchrony with the scan. The scans may be interlaced (alternating patterns).

Figure 43:
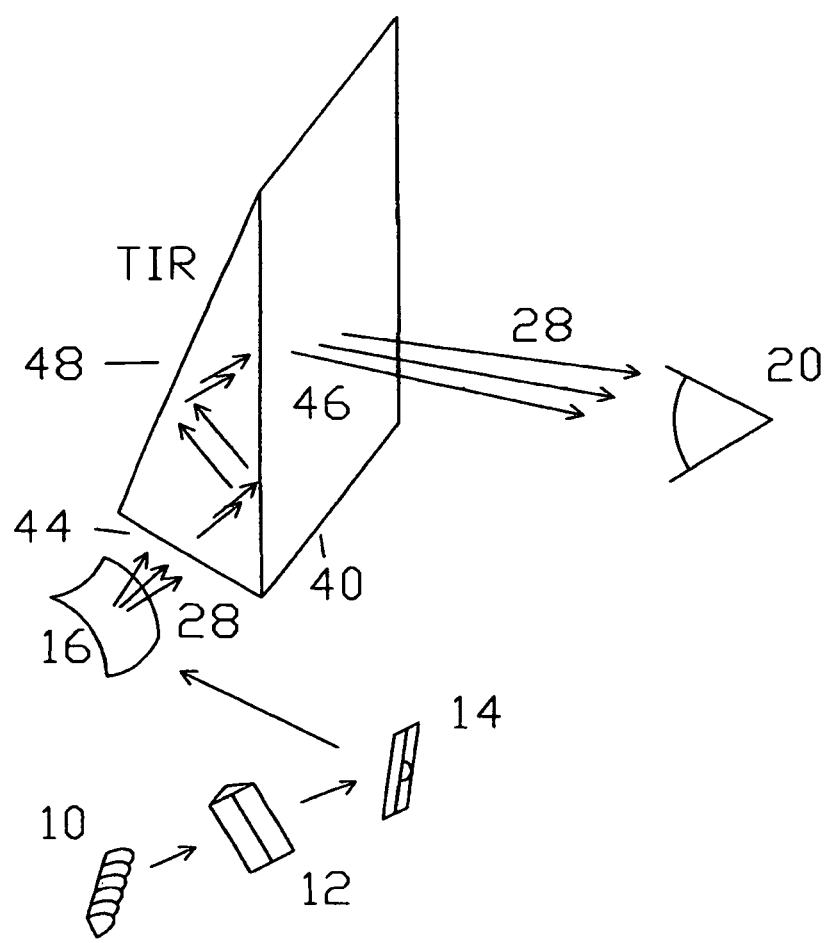

FIG. 43 present a linear accommodation embodiment where the LEE array 10 projects a fan shaped beam 28,28', 28''' from each pixel. When the fan beam 28 is perpendicular to the wedge axis of TIR prism 40, the optical path lengths are symmetrical about the principal axis of the beam 28 and facilitate visual accommodation. Further the necessary optics are simplified and the resolution of the system improved.

Chromatic control may be integrated or distinct, with separate LEEs for each color. While RGB combinations are well-known, additional colors including yellow, amber and purple may be included.

Accurate accommodation requires the adjustment of the base level for objects in the system. Thus an virtual object designed to by at 1 meter will require focal distance adjustment as it moves from the along the wedge axis. A LUT may be provided in the software to introduce the correction.

The shutter element 50 may be optically-active materials such as liquid crystal, (LC, FLC), dyes, or displaceable elements such as micro-mirrors, electrophoretic spheres, piezo-vanes, etc. While the embodiment shown places the LEE and prism vertically, the orientation may be horizontal or oblique. The TIR pathway may begin in the ear arm of a pair of eyeglasses and bend around the corner. The visor, LEE and other components may be curved or conform to a unique shape.

Figure 44:
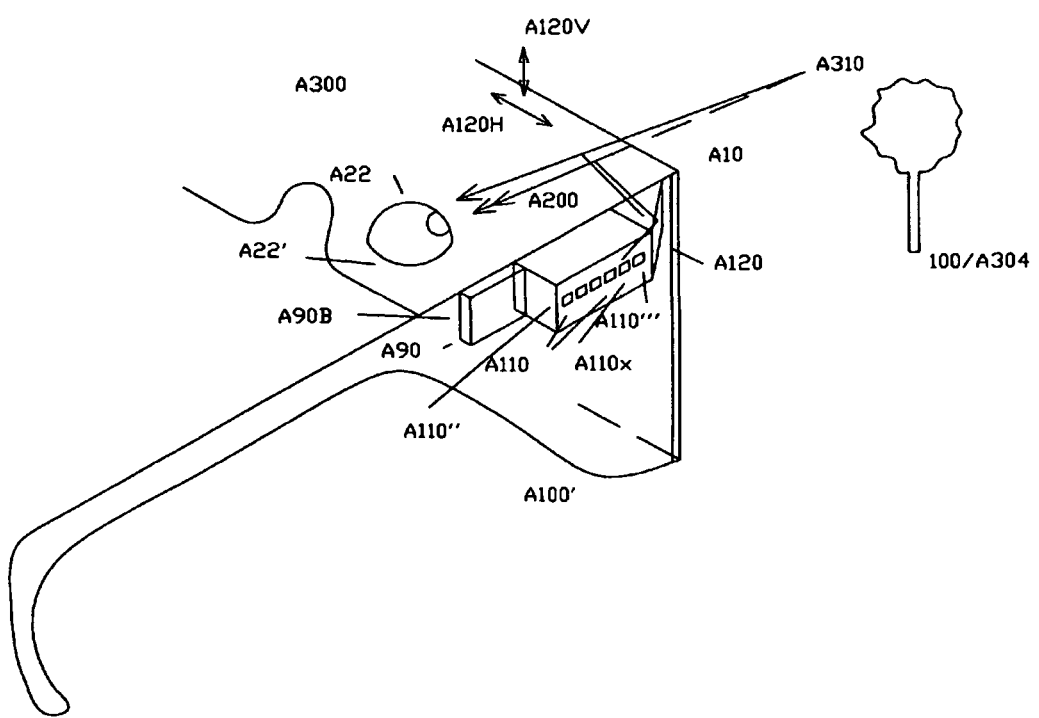

FIG. 44 shows a perspective view of the combined system A10 having a light emitting element (LEE) array A110, scanning optics A120 in the form of a two-axis, reflective scanner, and a partially reflective, micro-optical element visor or screen A300. The LEE array A110 and scanning optics A120 are controlled by computer assembly A90. Common to all head mounted displays and well known to those skilled in the art are a power source such as a battery A90B and a data receiving channel such as a television broadcast decoder or other data link. These are usually incorporated in the computer assembly A90 and therefore not shown separately.

In operation, the light beams A200, A200' (shown by single and double arrows respectively) from one of the LEE array elements A110*x* are cyclically scanned by the two-axis (vertical A120*v* and horizontal A120*h*), reflective scanner A120 across the partial reflective visor A300. The reflected beams A200, A200' directed towards the observer's eye A22 which, when in focus converge as a single point on the retina A22'. As is common in augmented reality systems, the partial reflective screen A300 also permits the observer to view the external environment A304. The percentage of reflectivity is commonly controllable by a number of well-known technologies including but not limited to LDC shutters. By scanning the entire screen at 30 frames per second, a stable, full virtual image A310 over a wide field of view is presented.

To the observer, the apparent distance between oneself and a light emitting element A110' is a function of the design focal length of the system which includes the focal lengths incorporated in the visor A300, the scanner A120, and the LEE array A110. Commonly, HMDs are set at about 12 feet. In a preferred embodiment of the present invention, the LEE array A110 is co-axial with the principal optical axis of the system and along this axis, the distal LEE element A110" is further away than the proximal LEE element A110'". As a result, the LEE elements A110 will each focus at a different virtual distance A310, and they may be simultaneously illuminated.

In my earlier inventions disclosed in U.S. patent application Ser. No. 07/779,066 and subsequent applications, co-axial image points could only be presented sequentially in time. One of the significant advantages of the present invention is that a multiplicity of co-axially elements may be simultaneously illuminated. In defense, medical and other applications where multiple targets frequently align co-axially, the present invention increases image comprehension and accuracy while improving the reaction time.

Figure 45:
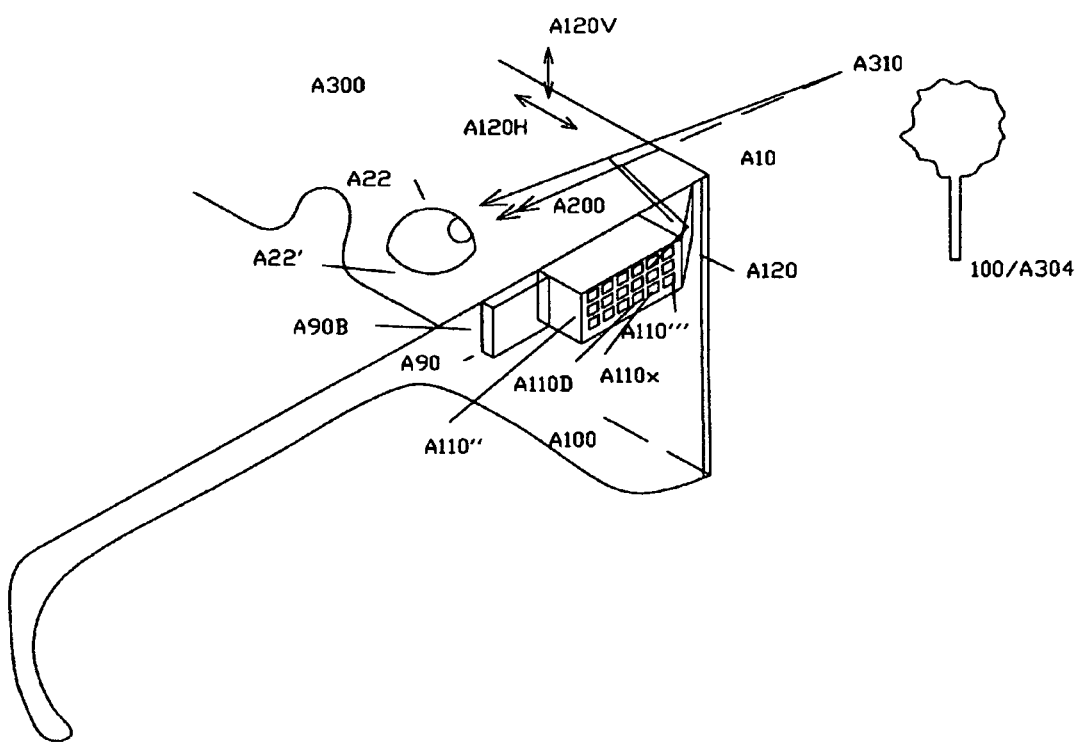

FIG. 45 shows the present invention with a two-dimensional (7×3), light emitting element array A110D. It may be understood that the size of the array is generally 4096×1024 and the virtual image 640-4096×1024. Two advantages of this preferred embodiment are the simplification of the scanner A120 from two-axis to one A120H, and reduction in the required frequency of illumination of the individual light emitting elements A110 for a given image resolution. While Fig. X2 shows the placement of the light source and scanning assembly A100 on the side of the head, any placement may be employed including but not limited to on the top or bottom of the head, on the cockpit dashboard, or a desktop.

Displays with visual accommodation produce an image by scanning a divergent beam from each image pixel directly into the field of view of the observer rather than forming a real image on a screen or surface, though embodiments may not implement the attribute. In the natural environment, the divergent beam is generally circular orthogonal to the principal axis between the center of the observer's eyelens and the originating image pixel. However, under certain natural and normal circumstances, including the polarized reflections from the surface of a body of water, beam may be elliptical or linear. Nonetheless, human visual accommodation is able to respond accurately.

A number of display configurations and technologies including those enabling visual accommodation may be enhanced, both in performance and manufacturability, by projecting a linear form of the divergent beam.

In my earlier patent applications including U.S. Pat. No. 7,799,066, I disclosed improvements to the well-known waveguide wedge taught in U.S. Pat. No. 4,212,048 by Donald Castleberry and U.S. Pat. No. 4,109,263 by Bruce Johnson of the Polaroid Corporation of Cambridge, Mass. Mr. Johnson was a co-employee of my colleague at MIT and Woods Hole, and his total internal reflection camera was often used as a visual display screen with a ground glass focusing element in place of the film. Both natural and projected images were used. My referenced enhancements have also been the subject of discussions with collaborators at MIT Professors Stephen Benton and Cardinal Ward.

While the application of the Johnson Wedge was well-known at MIT, it application was limited to the compactness of the optical path in connection with reprojection of the image from an often diffusive screen in the Johnson film plane. This is in part due the substantial different optical path lengths and visual focal distance between the display exit pixels at the base and tip of the wedge.

This preferred embodiment of the present invention addresses the application of the Johnson Wedge to devices which maintain the optical focal distance to the LEE.

FIG. 46 presents the thin-film preferred embodiment of the present invention having a generally linear pixel source 1100, a thin-film waveguide 1112, an extraction/activation layer 1114, an augmented occlusion layer 1110. In direct transmission operation, the vertically divergent beams 28, 28' are emitted by the pixel source 1100 and coupled to the thin-film waveguide 1112 in which they travel by total internal reflection or evanescent wave exiting at proper exit position 1116 along the waveguide 1112 and directed to the observer's eye 20. The visual accommodation faculty of human vision will adjust the focal distance of the observer's eye in response to the vertical divergence of the beams, obviating the need for a horizontal divergence which would demand a more complex optical waveguide for high resolution transmission.

The extraction/activation layer 1114 and thin film layer may be active or passive, reversed and function by direct or reflected extraction/activation. As an active extraction layer 1114 the construction may included but is not limited to an array of liquid crystal (LC, FLC) vertical linear apertures timed with the transmission, wavelength conversion using quantum dots, two photon conversion, embedded conversion elements, coupling evanescent waves, optical coherence tuning and other known optical technologies.

In addition as a passive extraction/activation layer, the construction may be of multiple planar layers with a thickness approaching evanescent wave dimensions and terminating or transitioning at a fixed distance. A 2000 layer system comprised of a transmission and spacing sub-layers may be less than 2 millimeters (1 micron thick layers) in thickness.

Figure 47:
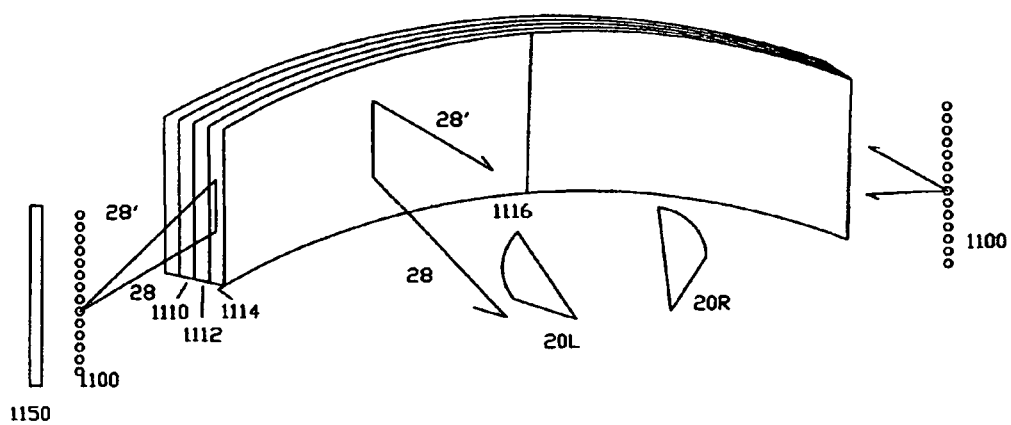

FIG. 47 presents one of many locations for an integrated camera element 1150 which records the position, orientation, iris, and focal length of the observer's eye from the reflected beam—which may be the image forming beam or an auxiliary beam including but not limited to a non-visible wavelength such infrared or ultraviolet.

Audience Effects Part

Figure 48:
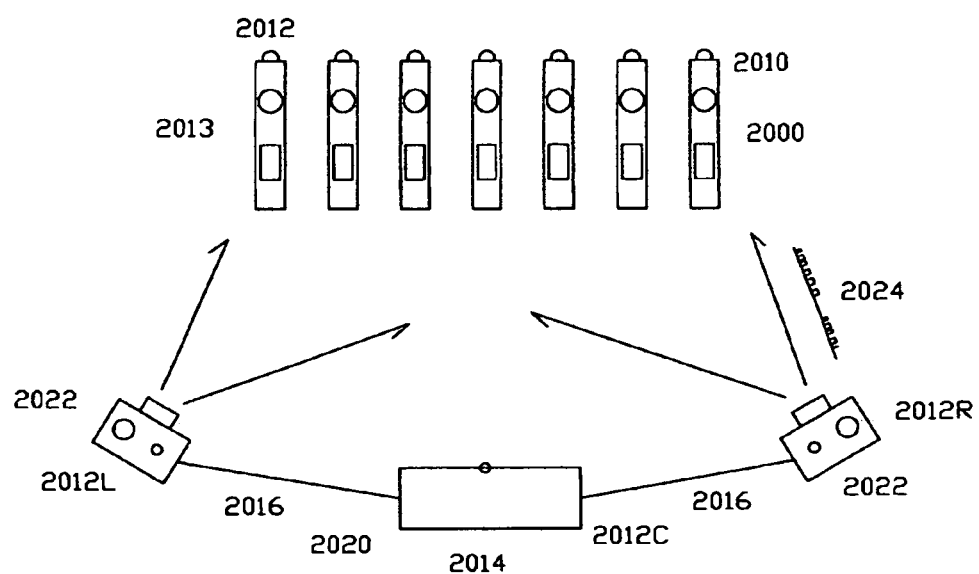
FIGS. 48-50 present preferred embodiments of audience effects elements employed with the present invention.

FIG. 48 presents an integrated visual display system which may be applied broadly to my related inventions having one or more fixed, movable, independent, handheld, suspended, and/or otherwise located device 2000, one, two or three dimensional visual emitters 2010, a wireless communications element 2012R, and a special effects module 2013 which may include audio, tactile, inertial, olfactory, or other effects, controlled by RF, acoustic or photonic devices 2012 from a control board or computer 2014.

In operation using infrared communication, the photonic control devices 2012 may be static or moving sources and spots having static, mechanically, optically or electronically patterns including but not limited to omnidirectional sources, regional fixed IR spotlights, moving gobo patterned spots, digital micro-mirrored device (DMD) electromechanically controlled patterning, LCD or other electronic patterning device. Multiple overlapping control devices 2012L, 2012C, 2012R may be used to provide full data signal coverage, and the specific patterns may be adjusted to present a single seamless data pattern of controlled intensity including but not limited to the methods employed with visible light projectors.

In operation, a carrier frequency 2024 such as 38 Khz, or 450 KHz may be imposed under the data signal. When multiple control devices 2012 are employed the carrier frequency may be synchronized electronically or optically, including by a wireless master carrier frequency synch signal 2020 and corresponding receivers 2022.

Figure 49:
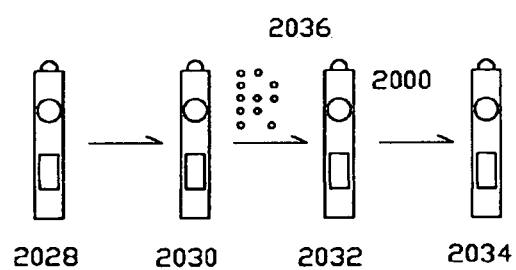

FIG. 49 presents a moving device 2000 having an embedded pattern 2036 which may be pre-coded or transmitted, and which displays upon receiving a sequence of activating signal at location 2028, 2030, 2032, 2034. A history of the device 2000 locations may be stored and used to adjust the proper timing and direction of the displayed pattern 2036.

FIG. 50 presents a balloon embodiment of the moving device 200 having an additional special effect altitude control 2042 including but not limited to a volume heater/cooler, volume pump, balloon surface tension material, chemical reaction or other known device to regulate the volume or buoyancy of a balloon. A bistable wire web may be employed to alternatively contract and expand the volume.

In operation, an upper 2014 and lower signal 2012 may be provided to regulate to the altitude to a given layer. Alternatively, the signal strength may be employed to cause the balloon to descend once it reaches a defined level or is lost.

Immersive Environment

Figure 51:
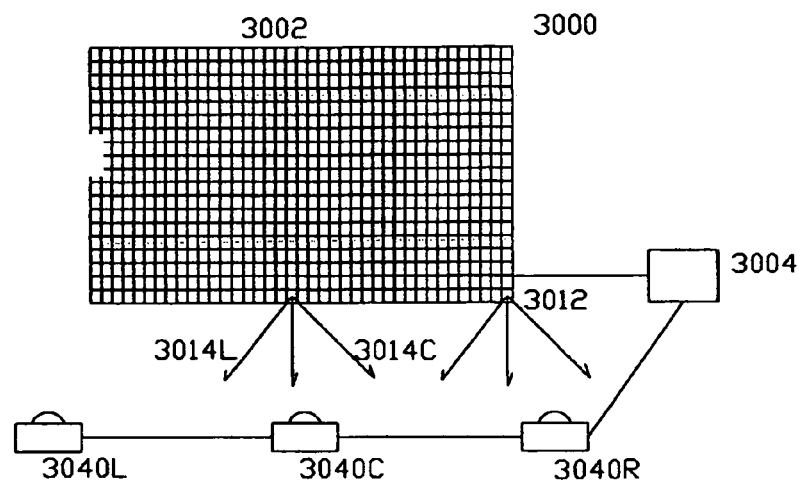
FIG. 51 presents an immersive environment embodiment.

FIG. 51 presents an improved beam holographic background display 3000 background having one or more digital beam holographic pixels 3012 which emit a complex pattern of light, horizontal and/or vertically, replicative of a virtual visual screen through which one views a 2 or 3-dimensional image of design. Details of the principles of operation have been presented in my earlier related applications. The improved display may be constructed by one or more columns 3002 of pixels, each column 3002 derived from the projection of one or more projection spatial light modulators (SLM) 3010. An SLM 3010 having a base resolution of 1024×768 may be expanded into a column of 768 pixels and 1024 horizontal views 3014'.

The column beam presentation 3014L at a given angle may be monitored by a sensor or camera 3040L and an appropriate correction may be applied by the internal controller or a central server 3004. The beam presentation may be an non-visible wavelength such as but not limited to infrared. If a number of the peripheral views of the SLM are reserved for correction, the system will be able to dynamically correct for substantial vibration, displacement or other interruptions. The percentage required is dependent on the conditions such that a fixed stable system may require only 4-6 pixel views while a mobile stage mounted system for outdoor shows may require 20-40 views.

Multiple sensors 3040L, 3040C, 3040R may be employed to increase the accuracy.

Figure 52A:
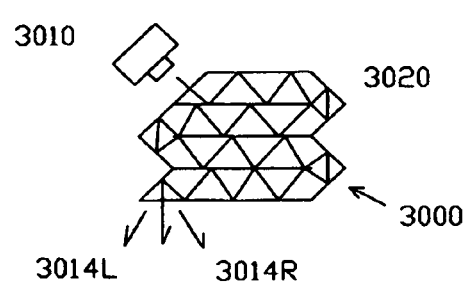
FIGS. 52A-54 present enhanced embodiments of the present invention.

FIG. 52A presents top view of a total-internal reflection differential expansion of the projected pattern of the SLM 3010 through a series of waveguides 3020.

Figure 52B:
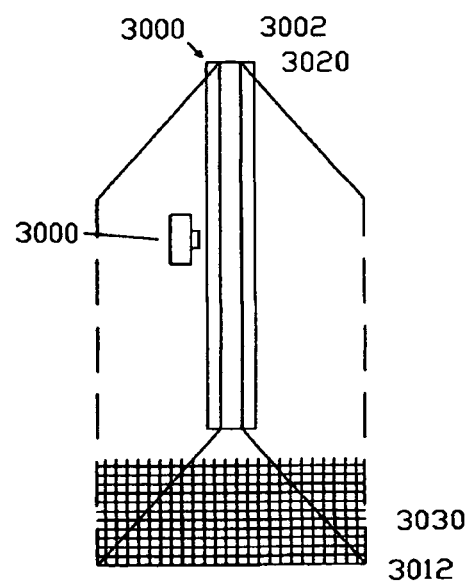

FIG. 52B presents a perspective view having the SLM 3020 centrally mounted proximal to the column 3002 and the projection grid 3030 shown.

Figure 53:
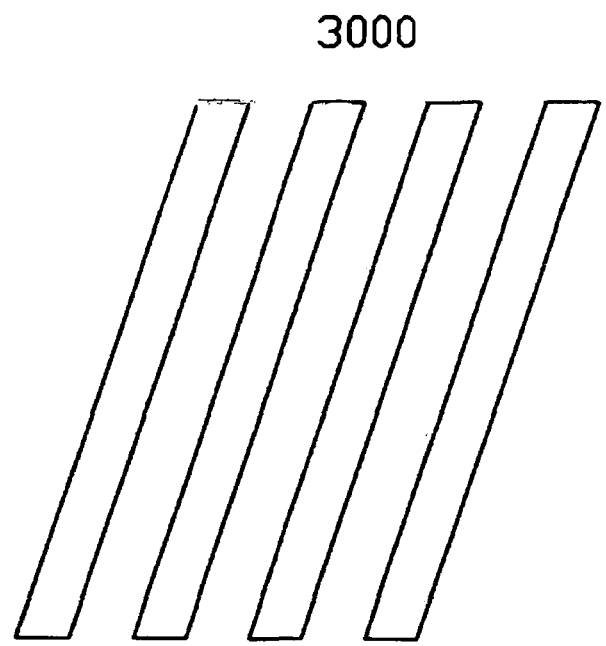

FIG. 53 presents the columns angled.

Figure 54:
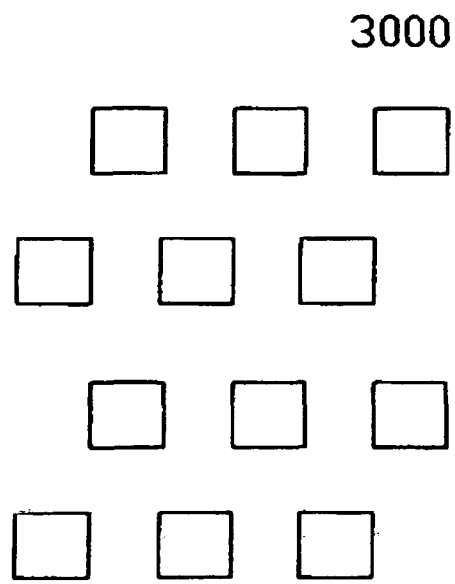

FIG. 54 presents the columns staggered and in parts.

As shown in FIG. 1, an integrated, coordinated display system may be created having a dynamic, three dimensional beam holographic background 3000, a visual space filled with moving pixel devices 2000, and an augment observer mounted display system.

Synchronization of Data, Phase and Carrier Frequency

High-speed, optical data streams are degraded by multimode paths whether in fiber or free air. It is well-known that most data communication protocols incorporate data error checks. These checks such as the basic checksum enable the receiver to ignore improperly formatted or received data. More sophisticated data error checks may provide correction algorithms.

Figure 55:
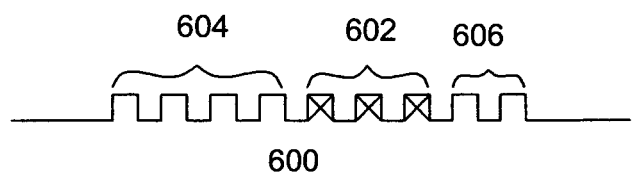
FIGS. 55 and 56 present an enhanced data structure embodiment of the present invention.

FIG. 55 presents a preferred method applying the data error bits 602 to an upper nibble 604, thereby enabling a first approximation of the greater value, and the remaining lower nibble or bits 606. The algorithm may allow a state change if the upper nibble data is OK, but not if only the lower nibble is OK. When used in a RGB (600×3) or other sequence for display applications, it enhances the continuity of the show at a small chance of minor error in small values of the display.

When these observations are applied to audience effects system, multimode paths principally arise from reflections in the environment, the audience and from uncoordinated data and carrier frequency effects.

Figure 56:
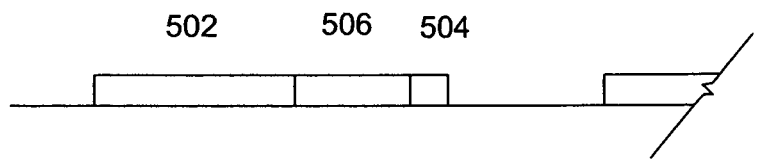

FIG. 56 presents a preferred method which enables the coordination of the controllers by the central control computer data stream 502 having a synch mark 504 and optional synchronization offset value 506. In operation, the synch mark initiates the controller emission sequence and the offset value 506 corrects the timing of the sequence to reflect the individual controller position, data transmission delay and other factors which cause the degradation of the signal.

In relation to synchronization, FIG. 2-AO presents a preferred method which enables the coordination of the controller/projector 100 by one or more global synch marks 504 in the form of a radiative pulse of RF, photonic, acoustic or other means from a generator properly located. the central control computer data stream 502, which may include but is not limited to DMX, RDM, ArtNET universes, having a synch mark 504 and optional synchronization offset value 506.

Both methods may be used to synchronize at the receiver position the data stream optionally including the phase and carrier frequency if used, from multiple controllers. Using these methods with line-of-sight photonic data streams enables multiple controllers from different direction to control receivers, often a lower power with less spurious reflections from the audience or environment than otherwise. These methods improve spatial resolution and controller system efficiency.

Image Enhancements by Sequential, Interlaced and Saccadic Frames

Wizard elements on an audience participant may have a single emitter or, in order to increase the apparent resolution—multiple, spatially—independent emitters. Each emitter may be controlled by a high resolution controller or alternatively by an increased data stream which incorporates the data required for each emitter.

Lower resolution displays may be enhanced through sequential or interlaced frames. Sequential frames cause the emitter to present sequentially a multiplicity of pixels of the image, each shifted by a small amount, at a higher emitter rate than normal. The human visual system integrates the sequential images by virtually spatially displacing each sequential pixel properly. In reality, the pixel hasn't physically moved. Virtual apparent resolution multiplications over 100 are possible.

Sequential Frames
  a. Higher Speed Data Frame and Refresh Rate (over 30 fps)

b. Multiple Sequential Data at Normal or Other Data Frame Rate—Higher Sequential Series
c. Compressed Data—The individual pixel data (RGB, for example) may be compressed using existing or custom codecs.

Interlaced Content Dependent Frames d. Higher Speed Data Frame and Refresh Rate (over 30 fps)
e. Multiple Sequential Data at Normal or Other Data Frame Rate—Higher Sequential Series
f. Compressed Data Enhanced Saccadic Spatial Displacement g. Saccadic Frame(s)

Figure 57A:
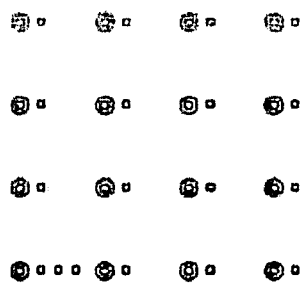
FIGS. 57A-C present preferred saccadic enhancement embodiments of the present.

FIG. 57A presents a preferred embodiment of the sequential frame method having a base image matrix of 4×4 elements s400 and 3 frames including the base frame 410, and virtual sequential frames 412 and 414, shown in their virtual position. It may be understood that the actual emitters are the base image matrix 400. Scene content and cues cause the virtual image to shift and the apparent resolution increase along the y-axis 404.

Figure 57B:
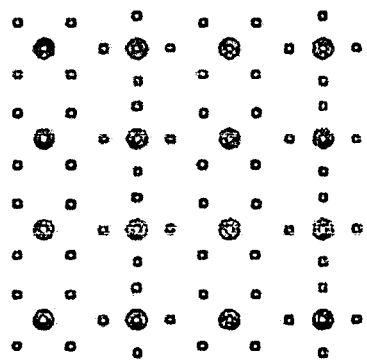

FIG. 57B presents a preferred embodiment of the interlaced frame method having a base image matrix of 4×4 elements s400 and 5 frames including the base frame 410, and virtual interlaced frames 412 through 418, shown in their virtual position interposed about the base frame 410. It may be understood that the actual emitters are the base image matrix 400. Scene content and cues cause the virtual image to shift and the apparent resolution increase along both axes.

Figure 57C:
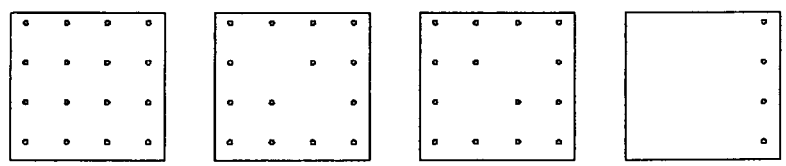

FIG. 57C presents a preferred embodiment of the enhanced saccadic method where a virtual frame having an fixation attractive (light) and repulsive (dark) overlay on the matrix base image causing the observer's fixation (saccadic) to shift in the designated direction. Many combinations of relative color and intensity caused predictability of saccades and may be found in the relevant journals including Journal of Vision Science and Vision Research which are incorporated by reference.

The embodiment of the invention particularly disclosed and described herein above is presented merely as an example of the invention. While the present invention is presented in a binocular environment, the novel elements may be applied to monoscopic or polyscopic devices, head mounted, near to eye, immersive, planar, television and cinema configurations. Other embodiments, forms and modifications of the invention coming within the proper scope and spirit of the appended claims will, of course, readily suggest themselves to those skilled in the art.

The invention claimed is:

1. A visual display system in the form of head-mounted eyeglasses having:
   a. Means transforming into a wristwatch-form embodiment comprising,
   b. An convertible frame having two temple arm assemblages,
   c. At least one eye lens region display enabling the display of information and images to the user's eye when in an eyeglasses embodiment,
   d. A convertible means enabling said temple arm assemblages to form a band enabling attachment to the user's wrist;
   d1. An articulated hinged pivot means in the bridge region of the convertible frame which enables the eye lens displays to fold upon itself and at least one of said eye region displays to be viewed in wristwatch form;
   d2. Articulate pivot means which enables said first eye region display proximal to the user's wrist to be protected by said second eye region display distal to the user's wrist;
   e. at least one means to enable the wearer to view the information on said eye lens display converted to a wristwatch-form embodiment;
   f. At least one power source means to provide power to the display and other functions; and
   g. At least one computational means to provide control and data for said display.

2. A transformative visual display system in accordance with claim 1, further comprising means for the augmented reality display of virtual information.

3. A transformative visual display system in accordance with claim 1, further comprising at least one sensor means to monitor the said user's physiology.

4. A transformative visual display system in accordance with claim 1, further comprising dynamic focus distance means for the accommodative display of the said eye region displays.

5. A transformative visual display system in accordance with claim 1, further comprising dynamic focus means for the accommodative display of image pixel information.

6. A transformative visual display system in accordance with claim 1, further comprising means for the total internal reflection (TIR) display of virtual information.

7. A transformative visual display system in accordance with claim 1, further comprising means for generating the display information by high-speed, scanning fiber optic light emitter array of at least one fiber.

8. A transformative visual display system in accordance with claim 1, further comprising at least one light-emitting element scanning means for generating said eye region displays.

9. A transformative visual display system in accordance with claim 1, further comprising variable display occlusion means for occluding the transmissive light from a region of said eye region display.

10. A transformative visual display system in accordance with claim 1, further comprising means for adjusting the position of the principal image axis in at least one eye region display such that an augmented image is properly registered including the interocular distance between user's eye.

11. A transformative visual display system in accordance with claim 1, further comprising camera sensor means for providing at least one view of the user's external actions, gestures and environment.

12. A transformative visual display system in accordance with claim 1, further comprising linear accommodation means enabling accommodative eye region displays.

13. A transformative visual display system in accordance with claim 1, further comprising said eye region display means having a multiplicity light emitters spaced-apart with intervening transparent regions.

14. A transformative visual display system in accordance with claim 1, further comprising holographic means to enable a focusable image to a viewer.

15. A transformative visual display system in accordance with claim 1, further comprising means to receiver an audience effects system optical directional data signal.

16. A transformative visual display system in accordance with claim 1, further comprising means for advanced visualization augmented reality.

17. A transformative visual display system in accordance with claim 1, further comprising means to receive a spatially-modulated, audience effects system, optical directional data signal and means to present the augment display of information and images specific to the spatially-modulated data signal at the received position.

18. A transformative visual display system in the form of head-mounted eyeglasses having:
   a. Means transforming into a wristwatch-form embodiment comprising,
   b. A convertible frame means having a articulated bridge having at least two degrees of freedom of articulation, at least one being rotational about the connecting axis of the bridge.
   c. At least one eye-lens display enabling the display of information and images to the user's eye when in an eyeglasses embodiment,
   d. A convertible means enabling said temple arm assemblages to form a band enabling attachment to the user's wrist;
   e. at least one means to enable the wearer to view the information on said eye lens display converted to a wristwatch-form embodiment.
   f. At least one power source means to provide power to the display and other functions, and
   g. At least one computational means to provide control and data for said display.

19. A transformative visual display system in accordance with claim 18, further comprising means to receiver an audience effects system optical directional data signal.

20. A transformative visual display system in accordance with claim 18, further comprising means to receive a spatially-modulated, audience effects system, optical directional data signal and means to present the augment display of information and images specific to the spatially-modulated data signal at the received position.

* * * * *